(12) United States Patent
Takeshima et al.

(10) Patent No.: US 10,001,537 B2
(45) Date of Patent: Jun. 19, 2018

(54) MAGNETIC RESONANCE IMAGING APPARATUS AND IMAGE PROCESSING APPARATUS

(71) Applicant: TOSHIBA MEDICAL SYSTEMS CORPORATION, Otawara-shi, Tochigi-ken (JP)

(72) Inventors: Hidenori Takeshima, Ebina Kanagawa (JP); Tomoyuki Takeguchi, Kawasaki Kanagawa (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 722 days.

(21) Appl. No.: 14/588,604

(22) Filed: Jan. 2, 2015

(65) Prior Publication Data
US 2015/0198683 A1 Jul. 16, 2015

(30) Foreign Application Priority Data
Jan. 16, 2014 (JP) ................................. 2014-006018

(51) Int. Cl.
*G01V 3/00* (2006.01)
*G01R 33/48* (2006.01)
*G01R 33/565* (2006.01)
*G01R 33/561* (2006.01)

(52) U.S. Cl.
CPC ... *G01R 33/4818* (2013.01); *G01R 33/56509* (2013.01); *G01R 33/482* (2013.01); *G01R 33/5611* (2013.01)

(58) Field of Classification Search
USPC ......................................................... 324/318
See application file for complete search history.

(56) References Cited

U.S. PATENT DOCUMENTS

| | | | |
|---|---|---|---|
| 5,987,347 A | 11/1999 | Khoury et al. | |
| 7,215,124 B1 * | 5/2007 | Purdy ................ | G01R 33/4818 324/309 |
| 7,489,962 B2 | 2/2009 | Cull et al. | |
| 7,616,836 B2 | 11/2009 | Valadez et al. | |

(Continued)

FOREIGN PATENT DOCUMENTS

| | | |
|---|---|---|
| EP | 1 542 165 | 6/2005 |
| JP | 11-242741 | 9/1999 |

(Continued)

OTHER PUBLICATIONS

Qin, L., et al., "Prospective head movement for high resolution MRI using an in-bore optical tracking system", Proc. Intl. Soc. Mag. Reson. Med., pp. 1828, vol. 15, (2007), 1 page.

(Continued)

*Primary Examiner* — Rodney Fuller
(74) *Attorney, Agent, or Firm* — Nixon & Vanderhye P.C.

(57) ABSTRACT

A magnetic resonance imaging apparatus according to an embodiment includes a sequence controller and an image generator. The sequence controller acquires k-space data corresponding to a predetermined quantity of encoding processes. The image generator extracts a plurality of data sets arranged in a time series from the k-space data, selects a data set from among the extracted plurality of data sets on the basis of a movement of a subject, and generates an image by using the selected data set.

17 Claims, 15 Drawing Sheets

(56) References Cited

U.S. PATENT DOCUMENTS

| | | | |
|---|---|---|---|
| 2006/0261810 A1* | 11/2006 | Fautz | G01R 33/5611 324/309 |
| 2011/0317901 A1* | 12/2011 | Allmendinger | A61B 6/032 382/131 |
| 2013/0285655 A1 | 10/2013 | Miyazaki et al. | |
| 2013/0285662 A1 | 10/2013 | Takeshima | |
| 2014/0015528 A1* | 1/2014 | Landschuetz | G01R 33/56509 324/309 |
| 2014/0301622 A1* | 10/2014 | Forman | G06T 11/005 382/131 |
| 2017/0123033 A1* | 5/2017 | Rasche | G01R 33/56391 |
| 2017/0199263 A1* | 7/2017 | Nickel | G01R 33/56509 |

FOREIGN PATENT DOCUMENTS

| | | |
|---|---|---|
| JP | 2005-161053 | 6/2005 |
| JP | 2007-505719 | 3/2007 |
| JP | 2008-500108 | 1/2008 |
| JP | 2012-010391 | 1/2012 |
| JP | 2013-148517 | 8/2013 |
| JP | 2013-240571 | 12/2013 |

OTHER PUBLICATIONS

Pruessmann, K.P. et al., "SENSE: Sensitivity Encoding for Fast MRI", Magnetic Resonance in Medicine, vol. 42, pp. 952-962, (1999), 11 pages.

Pruessmann, K.P. et al., "Advances in Sensitivity Encoding With Arbitrary k-Space Trajectories", Magnetic Resonance in Medicine, vol. 46, pp. 638-651, (2001), 14 pages.

\* cited by examiner

FIG.3
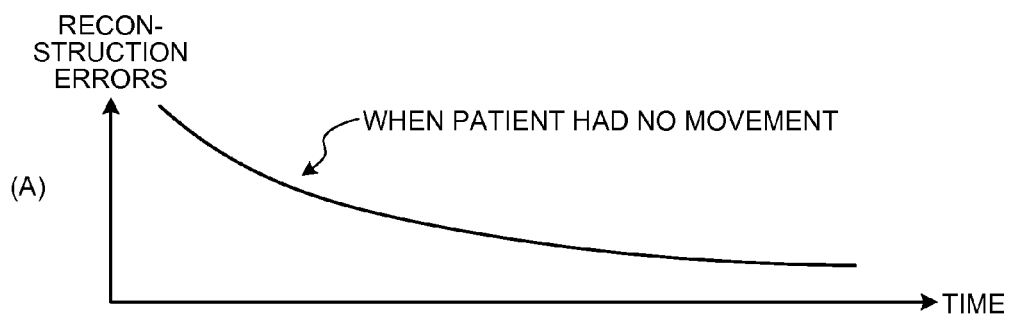
(A)
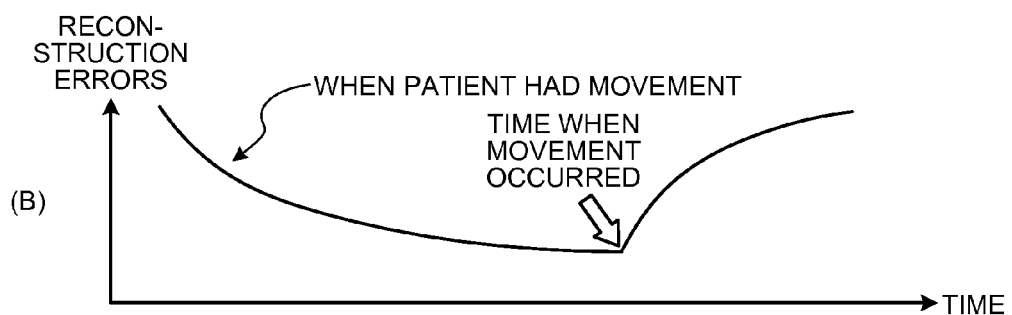
(B)
FIG.4
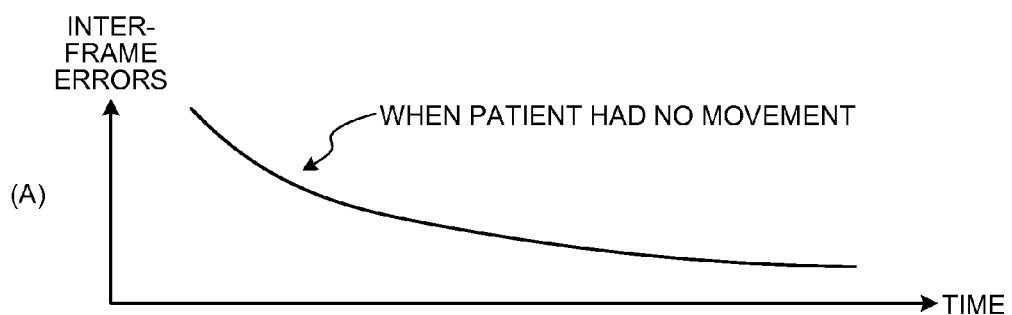
(A)
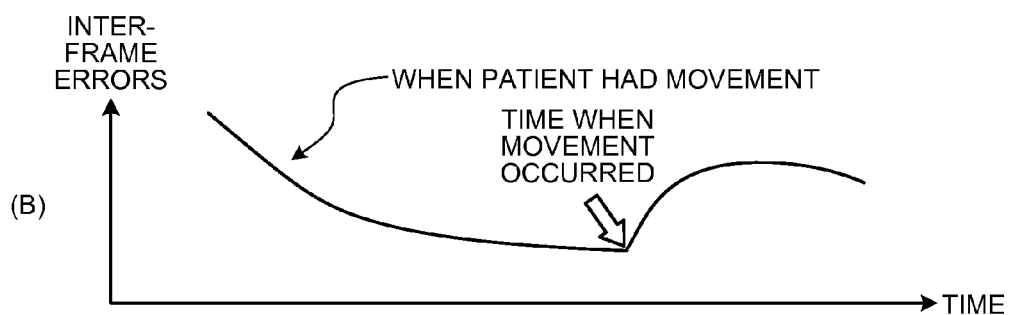
(B)

MAGNETIC RESONANCE IMAGING APPARATUS AND IMAGE PROCESSING APPARATUS

CROSS-REFERENCE TO RELATED APPLICATIONS

This application is based upon and claims the benefit of priority from Japanese Patent Application No. 2014-006018, filed on Jan. 16, 2014; the entire contents of which are incorporated herein by reference.

FIELD

Embodiments described herein relate generally to a magnetic resonance imaging apparatus and an imaging processing apparatus.

BACKGROUND

Magnetic resonance imaging apparatuses (hereinafter, "MRI apparatuses", as necessary) are apparatuses used for imaging information on the inside of a subject, by using a nuclear magnetic resonance phenomenon. An MRI apparatus acquires data called k-space data, by sampling nuclear magnetic resonance signals from specific atoms (e.g., hydrogen atoms) that are present on the inside of an object, by using coils. Further, the MRI apparatus reconstructs a Magnetic Resonance image (hereinafter, an "MR image", as necessary) by applying a Fourier transform to the k-space data.

The nuclear magnetic resonance signals (hereinafter, "MR signals", as necessary) are sampled as one-dimensional data. Thus, to obtain two- or three-dimensional reconstructed images, the MRI apparatus acquires the k-space data required by the reconstructing process by repeatedly performing one-dimensional sampling processes in the k-space. By sampling (full sampling) the k-space data at the same resolution as that of the MR image, it is possible to reconstruct the image by applying the Fourier transform to the obtained k-space data.

It is known that the sampling process of an MRI apparatus takes a long time. Further, the reconstructing process using the Fourier transform is based on the assumption that the subject remains still. If the subject has a movement during the imaging process, the k-space data obtained from the sampling process turns out to be data obtained by taking images of the subject that change from one imaging time to another. For this reason, if the Fourier transform is applied to such k-space data so as to reconstruct one image, there is a possibility that significant artifacts may occur.

As a method for reducing artifacts caused by movements, a method called a Periodically Rotated Overlapping Parallel Lines with Enhanced Reconstruction (PROPELLER) method is known. According to the PROPELLER method, an MRI apparatus acquires a number of lines called blades, in such a manner that the blades pass the center of a k-space. Further, while varying the sampling direction (the read-out direction), the MRI apparatus repeatedly acquires blades a number of times. Subsequently, after having acquired k-space data, the MRI apparatus corrects movements among the blades and integrates all the blades together, before performing a reconstructing process. According to this method, although the imaging time period increases, it is possible to reduce artifacts caused by movements. Further, even if another device different from the MRI apparatus takes images of the subject at the same time, it is possible to reduce artifacts caused by movements, by detecting the movement with the use of the taken images.

BRIEF DESCRIPTION OF THE DRAWINGS

FIG. 3 is a drawing for explaining reconstruction errors according to the first embodiment;

FIG. 4 is a drawing for explaining inter-frame errors according to the first embodiment;

DETAILED DESCRIPTION

A magnetic resonance imaging apparatus according to an embodiment includes a sequence controller and an image generator. The sequence controller acquires k-space data corresponding to a predetermined quantity of encoding processes. The image generator extracts a plurality of data sets arranged in a time series from the k-space data, selects a data set from among the extracted plurality of data sets on the basis of a movement of a subject, and generates an image by using the selected data set.

Exemplary embodiments of an MRI apparatus and an image processing apparatus will be explained below, with reference to the accompanying drawings. Possible embodiments are not limited to the exemplary embodiments described below. Further, the description of each of the exemplary embodiments is similarly applicable to any of the other exemplary embodiments, in principle.

First Embodiment

Figure 1:
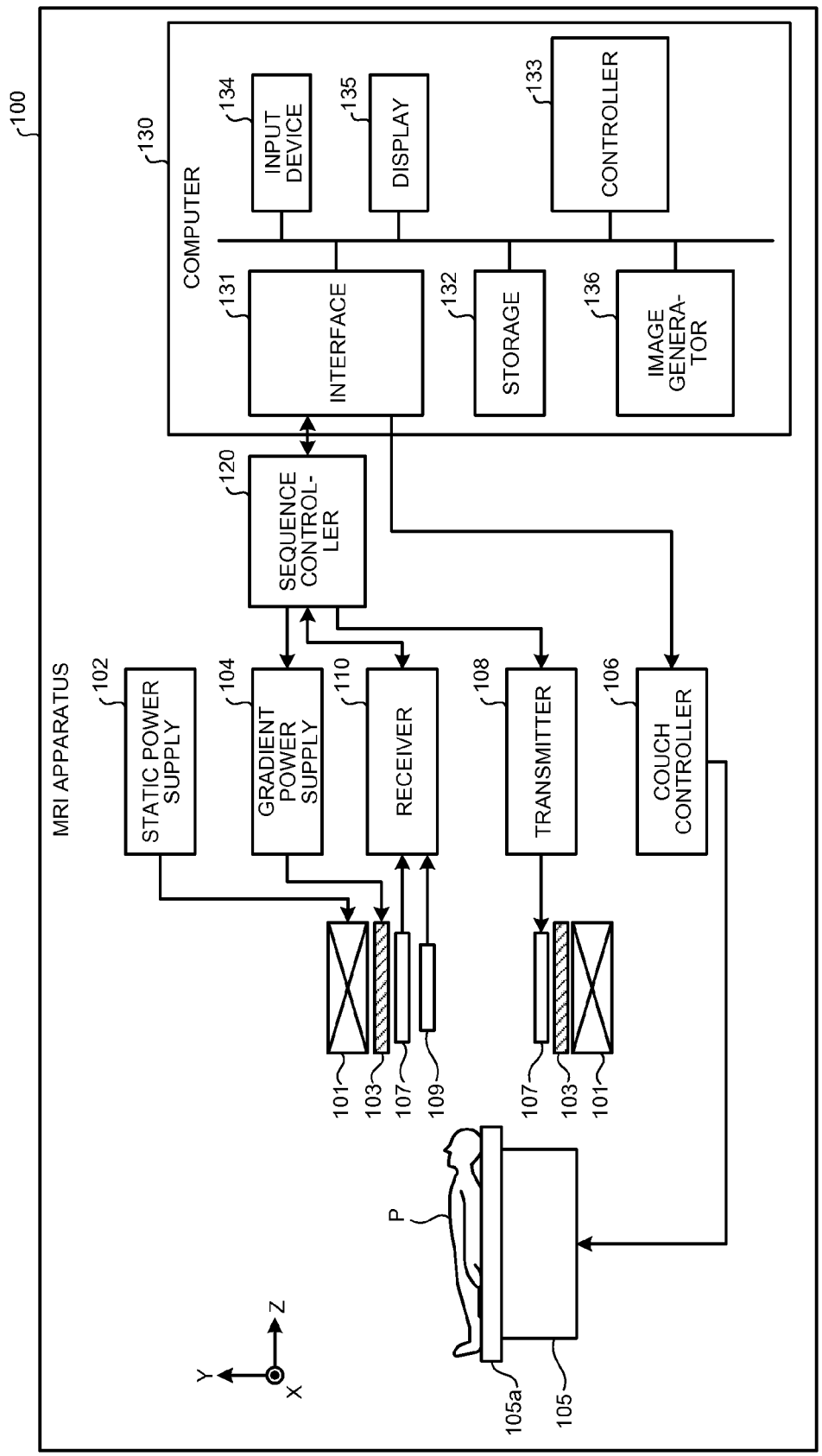
FIG. 1 is a functional block diagram of a configuration of an MRI apparatus according to a first embodiment.

FIG. 1 is a functional block diagram of a Magnetic Resonance Imaging (MRI) apparatus 100 according to a first embodiment. As illustrated in FIG. 1, the MRI apparatus 100 includes a static magnetic field magnet 101, a static power supply 102, a gradient coil 103, a gradient power supply 104, a couch 105, a couch controller 106, a transmission coil 107, a transmitter 108, a reception coil 109, a receiver 110, a sequence controller 120, and a computer 130. The MRI apparatus 100 does not include a subject P (e.g., a human body).

The static magnetic field magnet 101 is a magnet formed in the shape of a hollow circular cylinder and is configured to generate a magnetostatic field in the space on the inside thereof. The static magnetic field magnet 101 may be configured by using, for example, a superconductive magnet and is configured to be excited by receiving a supply of electric current from the static power supply 102. The static power supply 102 is configured to supply the electric current to the static magnetic field magnet 101. Alternatively, the static magnetic field magnet 101 may be configured by using a permanent magnet. In that situation, the MRI apparatus 100 does not need to include the static power supply 102. Further, the static power supply 102 may be provided separately from the MRI apparatus 100.

The gradient coil 103 is a coil formed in the shape of a hollow circular cylinder and is disposed on the inside of the static magnetic field magnet 101. The gradient coil 103 is formed by combining three coils corresponding to X-, Y-, and Z-axes that are orthogonal to one another. These three coils individually receive an electric current from the gradient power supply 104 and generate gradient magnetic fields of which the magnetic field intensities change along the X-, Y-, and Z-axes. It is assumed that the Z-axis direction is the same as the direction of the magnetostatic field.

The gradient power supply 104 supplies the electric current to the gradient coil 103. In this situation, the gradient magnetic fields on the X-, Y-, and Z-axes that are generated by the gradient coil 103 correspond to, for example, a slice-selecting-purpose gradient magnetic field Gs, a phase-encoding-purpose gradient magnetic field Ge, and a read-out-purpose gradient magnetic field Gr, respectively. The slice-selecting-purpose gradient magnetic field Gs is used for the purpose of arbitrarily determining an imaging cross-sectional plane. The phase-encoding-purpose gradient magnetic field Ge is used for the purpose of varying the phase of a Magnetic Resonance (MR) signal in accordance with a spatial position. The read-out-purpose gradient magnetic field Gr is used for the purpose of varying the frequency of an MR signal in accordance with a spatial position.

The couch 105 includes a couchtop 105a on which the subject P is placed. Under control of the couch controller 106, while the subject P is placed thereon, the couchtop 105a is inserted into the hollow (i.e., an imaging opening) of the gradient coil 103. Normally, the couch 105 is provided so that the longitudinal direction thereof extends parallel to the central axis of the static magnetic field magnet 101. Under control of the computer 130, the couch controller 106 is configured to drive the couch 105 so that the couchtop 105a moves in longitudinal directions and up-and-down directions.

The transmission coil 107 is provided on the inside of the gradient coil 103 and is configured to generate a radio frequency magnetic field by receiving a supply of a radio frequency (RF) pulse from the transmitter 108. The transmitter 108 is configured to supply the RF pulse corresponding to a Larmor frequency determined by the type of targeted atoms and the magnetic field intensities, to the transmission coil 107.

The reception coil 109 is disposed on the inside of the gradient coil 103 and is configured to receive MR signals emitted from the subject P due to the influence of the radio frequency magnetic field. When having received the MR signals, the reception coil 109 outputs the received MR signals to the receiver 110.

The receiver 110 is configured to generate MR data on the basis of the MR signals output from the reception coil 109. More specifically, the receiver 110 generates the MR data by applying a digital conversion to the MR signals output from the reception coil 109. Further, the receiver 110 is configured to transmit the generated MR data to the sequence controller 120. The receiver 110 may be provided on the gantry device side where the static magnetic field magnet 101, the gradient coil 103, and the like are provided.

The sequence controller 120 is configured to perform an imaging process on the subject P, by driving the gradient power supply 104, the transmitter 108, and the receiver 110, on the basis of sequence information transmitted from the computer 130. In this situation, the sequence information is information that defines a procedure for performing the imaging process. The sequence information defines: the intensity of the power source to be supplied from the gradient power supply 104 to the gradient coil 103 and the timing with which the power source is to be supplied; the strength of the RF pulse to be transmitted by the transmitter 108 to the transmission coil 107 and the timing with which the RF pulse is to be applied; the timing with which the MR signals are to be detected by the receiver 110, and the like.

Further, when having received the MR data from the receiver 110 as a result of the imaging process performed on the subject P by driving the gradient power supply 104, the transmitter 108, and the receiver 110, the sequence controller 120 transfers the received MR data to the computer 130.

The computer 130 is configured to exercise overall control of the MRI apparatus 100, to acquire data, to reconstruct images, and the like. The computer 130 includes an interface 131, a storage 132, a controller 133, an input device 134, a display 135, and an image generator 136.

The interface 131 is configured to transmit the sequence information to the sequence controller 120 and to receive the MR data from the sequence controller 120. Further, when having received the MR data, the interface 131 is configured to store the received MR data into the storage 132. The MR data stored in the storage 132 is arranged into a k-space by the controller 133. As a result, the storage 132 stores therein k-space data.

The storage 132 is configured to store therein the MR data received by the interface 131, the k-space data arranged in the k-space by the controller 133, image data generated by the image generator 136, and the like. For example, the storage 132 is configured by using a Random Access Memory (RAM), a semiconductor memory element such as a flash memory, a hard disk, an optical disk, or the like.

The input device 134 is configured to receive various types of instructions and inputs of information from an operator. For example, the input device 134 is a pointing device such as a mouse or a trackball, or an input device such as a keyboard. Under the control of the controller 133, the display 135 is configured to display a Graphical User Interface (GUI) used for receiving an input of an imaging condition and an image generated by the image generator 136, and the like. For example, the display 135 is a display device such as a liquid crystal display device.

The controller 133 is configured to exercise overall control of the MRI apparatus 100 and to control imaging processes, image generating processes, image display processes, and the like. For example, the controller 133 receives an input of an imaging condition (e.g., an imaging parameter) via the GUI and generates the sequence information according to the received imaging condition. Further, the controller 133 transmits the generated sequence information to the sequence controller 120. For example, the controller 133 is configured by using an integrated circuit such as an Application Specific Integrated Circuit (ASIC) or a Field Programmable Gate Array (FPGA), or an electronic circuit such as a Central Processing Unit (CPU) or a Micro Processing Unit (MPU).

The image generator 136 is configured to read the k-space data from the storage 132 and to generate an image by performing a reconstructing process such as a Fourier transform on the read k-space data. Details of the process performed by the image generator 136 will be explained later.

A Reconstructing Method According to the First Embodiment

Figure 2:
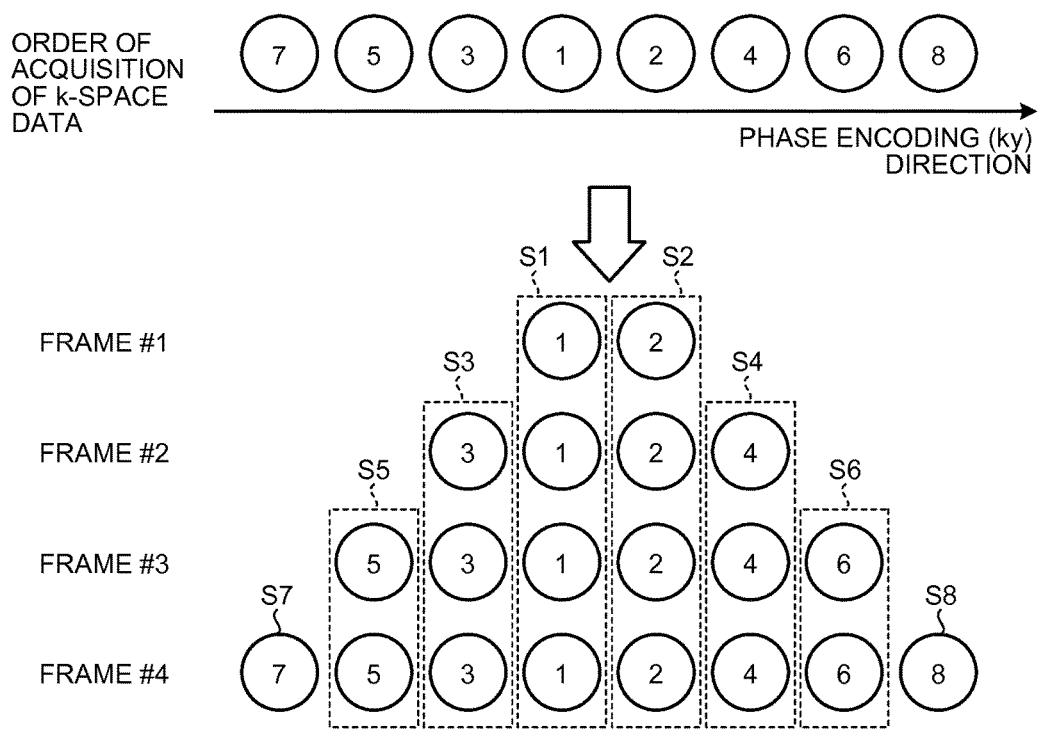
FIG. 2 is a drawing of an example of a data set extraction process according to the first embodiment.

Next, a reconstructing method according to the first embodiment will be explained, with reference to FIGS. 2 to 4. FIG. 2 is a drawing of an example of a data set extraction process according to the first embodiment. FIG. 3 is a drawing for explaining reconstruction errors according to the first embodiment. FIG. 4 is a drawing for explaining inter-frame errors according to the first embodiment.

In the first embodiment, an example is based on the assumption that k-space data corresponding to a two-dimensional cross-sectional image is acquired in two separate directions such as a read-out direction and a phase encoding direction. Further, it is assumed that the sampling process in the read-out direction is repeated while varying the position in the phase encoding direction. As for the order of acquisition, it is assumed that the data is sampled in an order from the center of the k-space toward the perimeter thereof. For example, in the first embodiment, it is assumed, as indicated in FIG. 2, that the MRI apparatus 100 samples data corresponding to eight encoding processes in the phase encoding direction, from the center of the k-space toward the perimeter thereof in a centric manner. The numerals "1" to "8" in FIG. 2 indicate the order of acquisition in the phase encoding direction. The read-out direction is omitted from FIG. 2.

In a normal image generating process, a reconstructing process using a Fourier transform is performed on the entirety of the acquired data (e.g., the entirety of the data corresponding to eight encoding processes). However, the image generator 136 according to the first embodiment does not necessarily perform the reconstructing process on the entirety of the acquired data. As explained in detail below, the image generator 136 extracts a plurality of data sets arranged in a time series from among the data acquired into the k-space in a time series and performs a reconstructing process using a Fourier transform on the extracted data sets. For example, the image generator 136 extracts data accumulated during a time period from a sampling start time to a time of interest (hereinafter "targeted time"), as a data set corresponding to the targeted time.

The explanation will be continued with reference to FIG. 2. From the data that corresponds to eight encoding processes and that was acquired into the k-space in a time series, the image generator 136 extracts data sets in a time series corresponding to four points in time (hereinafter, "time points"), while using a time point corresponding to data from two encoding processes as a unit time point. The data acquisition is performed in the order of S1, S2, S3, S4, S5, S6, S7, and S8 in FIG. 2. Thus, at the first time point (frame #1), it is assumed that the data up to S2 has been acquired. At the second time point (frame #2), it is assumed the data up to S4 has been acquired, in addition to the data up to S2 acquired up to the first time point. Similarly, at the third time point (frame #3) and the fourth time point (frame #4), the data set resulting from adding new pieces of data acquired up to the new time point to the pieces of data acquired up to the time point used in the immediately preceding stage is extracted as a data set for the new time point. In this manner, the image generator 136 extracts "frame #1" including data up to the data corresponding to the order of sampling "2"; "frame #2" including data up to the data corresponding to the order of sampling "4"; "frame #3" including data up to the data corresponding to the order of sampling "6"; and "frame #4" including data up to the data corresponding to the order of sampling "8".

In this situation, for the sake of convenience, the data set obtained when it is possible to acquire all the data at the first time point is considered as a correct data set. In that situation, a difference between an image obtained by reconstructing the data sets from different time points and an image obtained by reconstructing the correct data set will be referred to as a reconstruction error. If the subject has no movement, the reconstruction errors monotonously decrease, as indicated in FIG. 3(A). In particular, if the data is sampled in a centric manner from the center of the k-space toward the perimeter thereof, the amount by which the reconstruction errors decrease between the different time points is, due to characteristics of k-space data, expected to be larger at the first time point and is expected to be gradually smaller in the course of time, as the components become higher spatial frequency components. However, if the subject has a movement, as indicated in FIG. 3(B), the reconstruction errors monotonously decrease up to the time when the movement occurred, but increases after the time when the movement occurred.

If some data is missing, it is possible to realize the reconstructing process by, for example, reconstructing data in which the missing data is filled out with zeros. As another example, it is also acceptable to generate a sensitivity map from data acquired in advance and to perform a reconstructing process by implementing a parallel imaging method. As yet another example, it is also acceptable to acquire data close to the center of the k-space at the same resolution as output resolution, so as to estimate the missing data by implementing a Generalized Autocalibrating Partial Parallel Acquisition (GRAPPA) method. As yet another example, it is also acceptable to perform a reconstructing process by using a compressive sensing method.

Because of the characteristics of the reconstruction errors, if the correct data set was known, it would be possible to reconstruct an image with the highest image quality by estimating the time at which a movement occurred and reconstructing an image while using the data up to the time immediately before the time when the movement occurred. Because the correct data set is unknown, however, in order to realize the reconstructing process in the first embodiment, the time when the subject had a movement is specified from known data only.

More specifically, in the first embodiment, a function that can be calculated from known data only and that is used for detecting deviating values will be used. According to a method in the first embodiment, a function value of this function is calculated for each of the data sets at the different time points, and the function values are arranged in a time series, so as to detect a time at which a change speculated to be affected by a movement occurred.

In the first embodiment, as an example of the function used for detecting the deviating values, inter-frame errors will be used. To calculate the inter-frame errors, for example, with respect to a plurality of frames arranged in a time series, a difference image is calculated between a frame of interest (hereinafter, "targeted frame") and a frame that precedes the targeted frame by a predetermined value in terms of the ordinal positions, and further, for example, an L1 norm value thereof (a sum of L1 norm components) is calculated. If the subject had no movement, the inter-frame errors are expected to monotonously decrease, as indicated in FIG. 4(A). If the subject had a movement, the inter-frame errors are expected to significantly increase after the time when the movement occurred, as indicated in FIG. 4(B). Unlike the reconstruction errors, the inter-frame errors may decrease afterwards; however, by detecting the time at which the inter-frame error value significantly increases, it is possible to specify the time at which the movement occurred. If the time at which the movement occurred is specified, it is possible to reconstruct an image by using a data set that is not affected by the movement and that corresponds to a time point having the largest amount of data. It is therefore possible to reconstruct an image having the highest image quality.

The explanation above is based on the example in which the L1 norm is calculated. The L1 norm can be calculated by applying p=1 to Expression (1) below.

$$\left(\sum_i |x_i|^p\right)^{\frac{1}{p}} \quad (1)$$

However, possible embodiments are not limited to the example using the L1 norm. Other norms (e.g., an L2 norm or an L½ norm) may be used. It is to be noted, however, that it is desirable to use a norm where p is equal to or smaller than 1 (e.g., an L1 norm or an L½ norm), because a higher detection capability for small changes is achieved. Alternatively, instead of using norm values, it is also acceptable to count the number of pixels of which the error value exceeds a threshold value. (The counted value will be referred to as an "L0 norm", for the sake of convenience in the explanation.)

Pixels having artifacts due to a change occurred with the subject have error values. The L2 norm is strongly impacted by pixels having large error values. In contrast, the L1 norm, the L½ norm, and the L0 norm are more strongly impacted by the quantity of pixels having errors, rather than by how large the error values are. Further, the L1 norm of a difference is known as a Sum of Absolute Differences (SAD), and apparatuses and circuits including exclusive-use high-speed calculating means are available. For these reasons, if the user wishes to select an image having a small quantity of error pixels at a small calculation cost, using the L1 norm is considered to be one of practically good ideas. However, as mentioned above, the L1 norm does not necessarily have to be used, and the explanation herein is not intended to prevent the use of norms other than the L1 norm.

Figure 5:
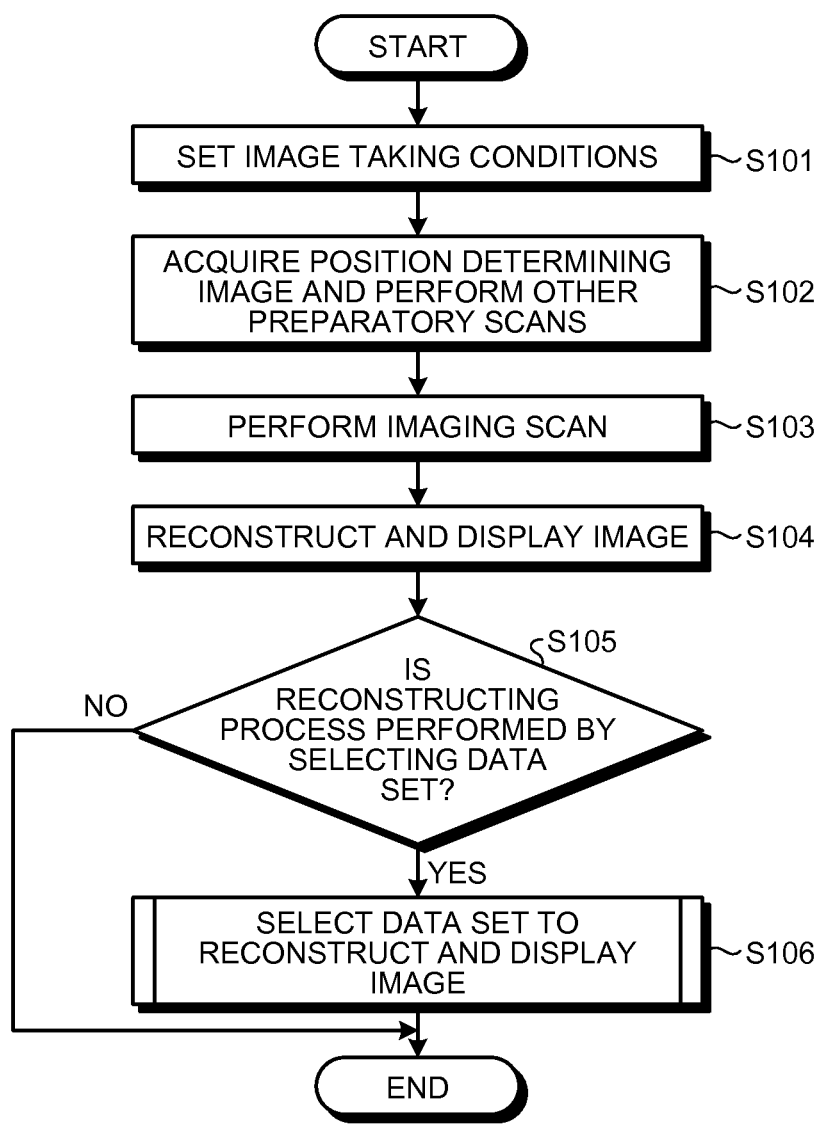
FIG. 5 is a flowchart of a processing procedure performed by the MRI apparatus according to the first embodiment.

FIG. 5 is a flowchart of a processing procedure performed by the MRI apparatus 100 according to the first embodiment. The processing procedure indicated in FIG. 5 is merely an example. For example, the flowchart in FIG. 5 illustrates an example in which the procedure from the imaging process to the image generating process is performed as a series of processes; however, possible embodiments are not limited to this example. For instance, the procedure after the image generating process may be performed as a post-processing process, separately from the imaging process.

At step S101, an operator of the MRI apparatus 100 selects, by using the GUI used for inputting imaging conditions, a group of protocols (e.g., a protocol for acquiring position determining images, a protocol for a shimming imaging process, a protocol for an imaging scan) used for obtaining, for example, an image of the brain. In this situation, the "protocols" refers to pulse sequence information including information that is set in advance (pre-set information) for imaging conditions. For example, when making an imaging plan of a medical examination, the operator such as a medical doctor or a medical technician causes a group of protocols managed and offered by the MRI apparatus to be read into the GUI used for inputting the imaging conditions and incorporates the pre-set setting information into the imaging plan while changing the setting information as necessary. Each of the protocols includes: a "scan ID" which is equivalent to the name of the protocol and a "time" indicating the imaging time of the protocol, as well as setting information of various types of imaging parameters such as a repetition time (TR) value, an echo time (TE) value, a flip angle (FA), the number of slices (NS), the field of view (FOV), and the slice thickness (ST). In the first embodiment, the order of sampling in the k-space is also configured into the protocols, in advance. In the example explained below, the order of sampling is set to "centric", which is to sample the data in a centric manner from the center of the k-space toward the perimeter thereof.

Subsequently at step S102, according to the group of protocols set at step S101, the sequence controller 120 at first acquires position determining images and performs other preparatory scans. The acquired position determining images are displayed on the display 135. The operator sets an imaging position of an imaging scan within the position determining images. For example, as the position determining images, an axial cross-sectional image, a sagittal cross-sectional image, and a coronal cross-sectional image of the head of the subject are acquired and displayed. Within these cross-sectional images, the operator sets the position of a cross-sectional image to be acquired in the imaging scan.

Subsequently at step S103, according to the position set at step S102, the sequence controller 120 performs the imaging scan and acquires MR data. After that, k-space data is stored into the storage 132.

Subsequently at step S104, the image generator 136 reconstructs an image by using the k-space data acquired at step S103 and causes the display 135 to display the reconstructed image. In this situation, the image generator 136 at first performs, as usual, a reconstructing process using a Fourier transform on the entirety of the acquired data and causes the display 135 to display the resulting image. If the subject has no movement during the imaging scan to acquire the data of one cross-sectional image of the brain, no artifact occurs even if the reconstructing process is performed on the entire data. On the contrary, if the subject has a movement (e.g., if the subject moved his/her head during the imaging scan), there is a possibility that an artifact may occur.

To cope with this situation, at step S105, the image generator 136 receives, at this stage, an instruction from the operator indicating whether the reconstructing process is performed again (redone), by selecting a data set. For example, the image generator 136 causes pressing buttons such as "redo the reconstructing process" and "end" to be displayed on the display 135 and receives pressing of one of the buttons from the operator. For example, the operator presses the "end" button when no artifact is visually recognized. Accordingly, "No" is selected at step S105, and the series of processes is ended. On the contrary, when an artifact is visually recognized, the operator presses the button "redo the reconstructing process". Accordingly, "Yes" is selected at step S105.

At step S106, the image generator 136 subsequently selects a data set, reconstructs an image again, and displays the reconstructed image. Details of the process at step S106 will be explained below, with reference to FIG. 6.

Figure 6:
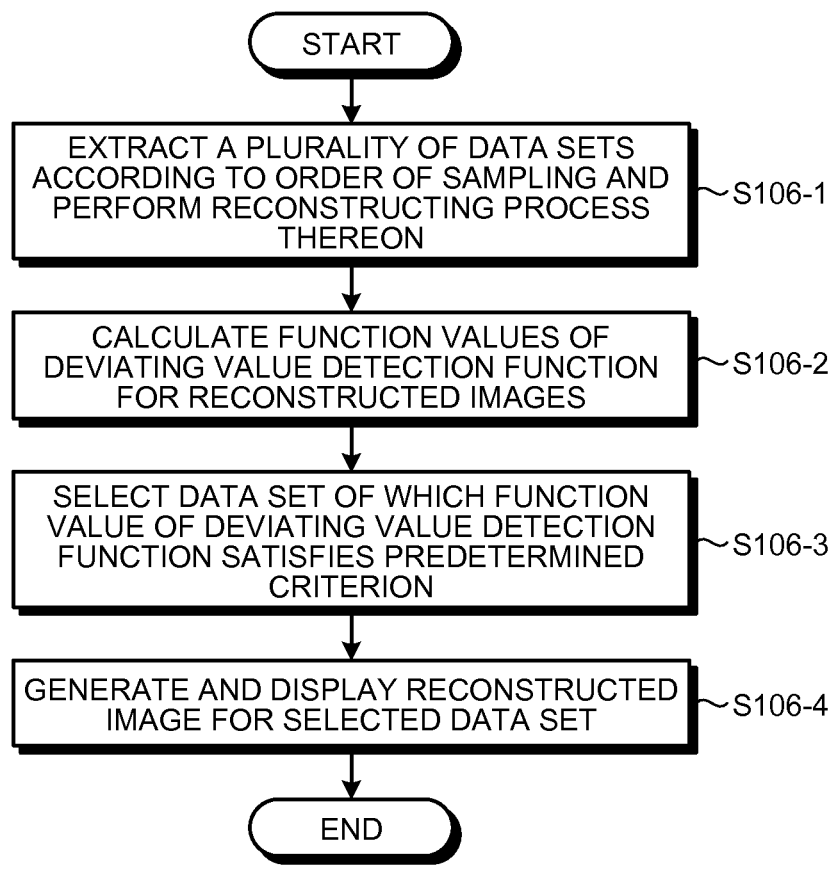
FIG. 6 is a flowchart of a processing procedure in an image generating process according to the first embodiment.

FIG. 6 is a flowchart of a processing procedure in the image generating process according to the first embodiment. It is assumed that the image generator 136 has already obtained the information about the order of sampling in the k-space that was set at step S101.

At step S106-1, according to the order of sampling in the k-space, the image generator 136 extracts a plurality of data sets arranged in a time series, from the k-space data acquired at step S103 and further performs a reconstructing process on the extracted data sets. For example, as explained with reference to FIG. 2, from the data that corresponds to eight encoding processes and that was acquired into the k-space in a time series, the image generator 136 extracts data sets in a time series corresponding to four time points, while adding data in accordance with the order of sampling. The quantity of encoding processes and the quantity of data sets are merely examples and may arbitrarily be changed.

Subsequently at step S106-2, the image generator 136 calculates function values of the function used for detecting deviating values (hereinafter, "deviating value detection function"), for the reconstructed images from the data sets. For example, the image generator 136 calculates a difference image between a reconstructed image at a targeted time and a reconstructed image at the immediately preceding time point and further calculates an L1 norm with respect to the pixel values included in the difference image.

Subsequently at step S106-3, the image generator 136 selects a data set of which the function value of the deviating value detection function satisfies a predetermined criterion. For example, from among the plurality of data sets, the image generator 136 selects such a data set for which the difference between the function value thereof at a targeted time and the function value at the immediately preceding time point does not exceed a predetermined threshold value, and also, of which the time is the latest (having the largest value).

Subsequently at step S106-4, the image generator 136 generates a reconstructed image for the data set selected at step S106-3 and causes the display 135 to display the generated reconstructed image. In this situation, the image generator 136 may cause the reconstructed image that has already been generated at step S106-1 to be displayed without any modification or may newly generate a reconstructed image after selecting the data set and cause the newly-generated reconstructed image to be displayed. With the latter option, for example, at step S106-1, a method which does not yield high image quality for reconstructed images, but has a low reconstruction processing cost (e.g., by omitting a filter calculation) is implemented, to such an extent that does not change the relationship of magnitudes between the errors. At step S106-4, a method which has a high reconstruction processing cost, but yields high image quality for reconstructed images (e.g., by additionally performing a filter calculation) is implemented. As a result, it is possible to realize a reconstructing process with high image quality, while suppressing the reconstruction processing cost.

The processing procedure described above is merely an example. For instance, in the embodiment described above, the example is explained in which the reconstructing process is performed on all of the plurality of data sets extracted from the k-space data, so that the function values of the deviating value detection function are calculated with respect to the reconstructed images from all the data sets. However, possible embodiments are not limited to this example.

In the embodiment described above, the example is explained in which the extraction of the plurality of data sets and the calculation of the function values are collectively performed at once; however, possible embodiments are not limited to this example. For instance, the image generator 136 may, at first, extract the data sets for the first time point and the last time point and perform the processes at steps S106-1 through S106-3 illustrated in FIG. 6. Subsequently, the image generator 136 may repeatedly perform the processes at steps S106-1 through S106-3, by adding a data set corresponding to the time point exactly in the middle of two targeted data sets and eliminating one of the two targeted data sets having the higher function value (the lower function value according to the criterion at step S106-3). By using this method called a binary search, the image generator 136 is able to select a data set that satisfies the criterion at step S106-3 (or that approximately satisfies the criterion, depending on the deviating value detection function and the criterion being used), by calculating the function values a small number of times.

In another example, the image generator 136 may narrow down, in advance, the data sets of which the function values are to be calculated, so that the function values to be selected from are calculated only with respect to the reconstructed images from those data sets. For example, although the image generator 136 extracts the data sets while adding the data according to the order of sampling, if certain data sets have an extremely small data amount, it is concerned that there may not be a sufficient amount of data, before artifacts caused by movements are concerned. To cope with this situation, the image generator 136 may, for example, omit the extraction of such data sets that have an extremely small data amount, the generation of the reconstruction images thereof, and the calculation of the function values thereof, so as to exclude those from the targets of selection. For example, when the entirety of the k-space data corresponds to 256 encoding processes, the image generator 136 is able to exclude data sets corresponding to encoding processes smaller than 128 from the targets of selection. In another example, the image generator 136 may determine, in advance, the quantity of encoding processes corresponding to the data sets to be used as the targets of selection, so that only the data sets corresponding to the quantity of encoding processes are extracted, the reconstruction images thereof are generated, and the function values thereof are calculated.

Further, in the example illustrated in FIG. 2, the data sets are extracted by using the time point corresponding to the data from two encoding processes as the unit time point; however, possible embodiments are not limited to this example. The image generator 136 may extract data sets while using a time point corresponding to the data from one encoding process as the unit time point or may extract data sets while using a time point corresponding to the data from three or more encoding processes as the unit time point. Because it is considered that the difference made by a small quantity of encoding processes will not result in so significant a difference, the image generator 136 may set the width between the unit time points larger, as necessary, in order to reduce the processing load.

Further, in the exemplary embodiment above, the processing procedure is explained in which the reconstructing process is performed as usual at first, before the operator checks the result thereof and selects the data set as necessary; however, possible embodiments are not limited to this example. For instance, the image generator 136 may omit the usual reconstructing process, select a data set on the assumption, to begin with, that the subject had a movement, and cause the display 135 to display a reconstructed image from the selected data set.

Further, in the exemplary embodiment above, the example is explained in which the data sets are selected by the automatic processing by the MRI apparatus 100; however, it is difficult to completely eliminate the possibility of misjudging a time when no movement occurred as a time when a movement occurred or misjudging a time when a movement occurred as a time when no movement occurred. For this reason, the operator may not wish to use the complete automatic processing. In that situation, for example, the image generator 136 may cause the display 135 to display reconstructed images from a plurality of data sets and determine a data set to be selected by receiving an instruction from the operator. For example, the image generator 136 may cause the display 135 to display a reconstructed image from a data set selected as a candidate from among the plurality of data sets and reconstructed images from data sets that were not selected as candidates, and further select one of the data sets by receiving a selection made by the operator.

Figure 7:
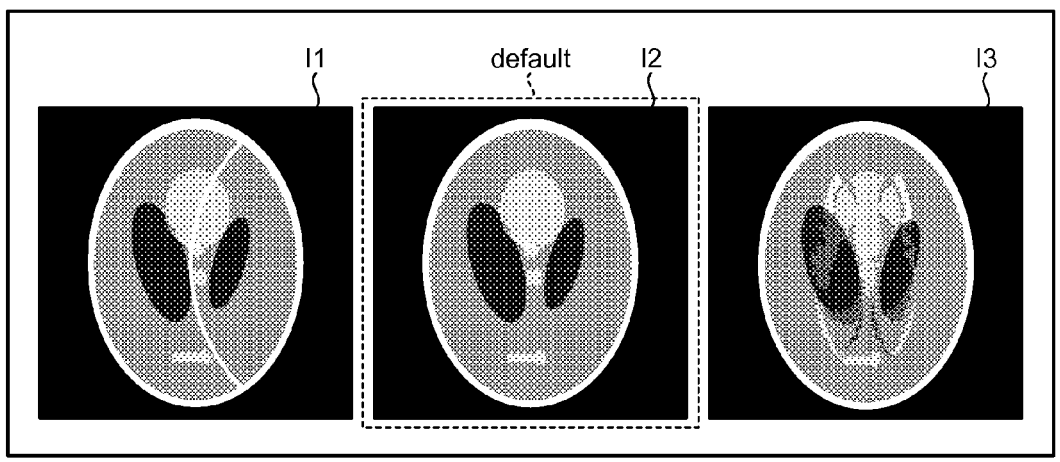
FIG. 7 is a drawing of a data set selecting screen according to a modification example of the first embodiment.

FIG. 7 is a drawing of a data set selecting screen according to a modification example of the first embodiment. In a situation where the time at which the difference between the function value at a targeted time and the function value at an immediately preceding time point exceeds a predetermined threshold value is estimated to be a "time at which the subject had a movement", the image generator 136 causes the display 135 to display, as illustrated in FIG. 7, a reconstructed image I1 at a time earlier than the "time at which the subject had a movement", a reconstructed image I2 at the "time at which the subject had a movement", and a reconstructed image I3 at a time later than the "time at which the subject had a movement". Further, as illustrated in FIG. 7, the image generator 136 causes the reconstructed image I2 at the "time at which the subject had a movement" to be displayed, while being selected as a reconstructed image at an initial state.

When the GUI as described above is offered to the operator, the operator is able to check the reconstructed images, to use the reconstructed image in the initial state without any modification if the reconstructing process was performed as expected, and conversely, to select a reconstructed image at a different time point if the reconstructing process was not performed as expected. In other words, the image generator 136 causes the display 135 to display both the reconstructed image from the data set that was selected according to the automatic recognition of the movement and the reconstructed images from the data sets that were not selected according to the automatic recognition of the movement and offers the GUI that makes it also possible to use either of the data sets that were not selected by the automatic recognition, in response to an instruction from the operator.

The first embodiment described above can be summarized as follows: First, the sequence controller 120 acquires the data corresponding to the first quantity of encoding processes as the k-space data. Further, the image generator 136 generates an image by selectively using data corresponding to a second quantity of encoding processes selected from among the data corresponding to the first quantity of encoding processes, the second quantity being smaller than the first quantity. Further, at this time, the image generator 136 generates the image by extracting, from among the data corresponding to the first quantity of encoding processes, the plurality of data sets arranged in the time-series, while increasing, at stages, the quantity of encoding processes for the data to be included in the data sets, according to the order of sampling (the order of acquisition) of the k-space data and selecting the data set including the data corresponding to the second quantity of encoding processes from among the extracted plurality of data sets.

Further, the image generator 136 selects the data sets on the basis of the movement of the subject. For example, the image generator 136 calculates the function values between the data sets and specifies the data set corresponding to the time at which the subject had the movement from among the plurality of data sets, on the basis of the calculated function values. After that, the image generator 136 generates the image by selecting such a data set that corresponds to a time earlier in the time series than the time corresponding to the specified data set and that has the largest quantity of encoding processes for the data. In other words, the image generator 136 generates the image by selecting such a targeted data set for which the difference between the function value thereof and the function value of another data set having a smaller quantity of encoding processes than the targeted data set is equal to or smaller than the predetermined threshold value and which has the largest quantity of encoding processes for the data.

As explained above, according to the first embodiment, even if the subject had a movement during the sampling of the k-space data, the image is generated by using only the data in such a range that is not affected by the movement. It is therefore possible to reduce the artifacts caused by the movement. Further, according to the first embodiment, even if the subject had a movement, it is possible to avoid, to the best possible level, the situation where the imaging process has to be redone. In other words, it is possible to shorten the time period required by the imaging process.

Second Embodiment

Next, a second embodiment will be explained. In the first embodiment described above, the sampling method is explained by which the k-space data is acquired from the center of the k-space toward the perimeter thereof in a centric manner; however, possible embodiments are not limited this example. For instance, the present disclosure is similarly applicable to a method by which data is sampled in a sequential manner, while the position in the phase encoding direction is shifted by a unit amount every time. It is to be noted that, however, according to the centric sampling method, the data of the higher spatial frequency components are gradually added to the data at the center of the k-space (i.e., the data of the low frequency components), because the data is gradually added simply according to the order of sampling. In contrast, according to the sequential sampling method, because the data at the center of the k-space is acquired halfway through the sampling process, it is desirable to extract data sets by using a method described below, in view of characteristics of k-space data.

Figure 8:
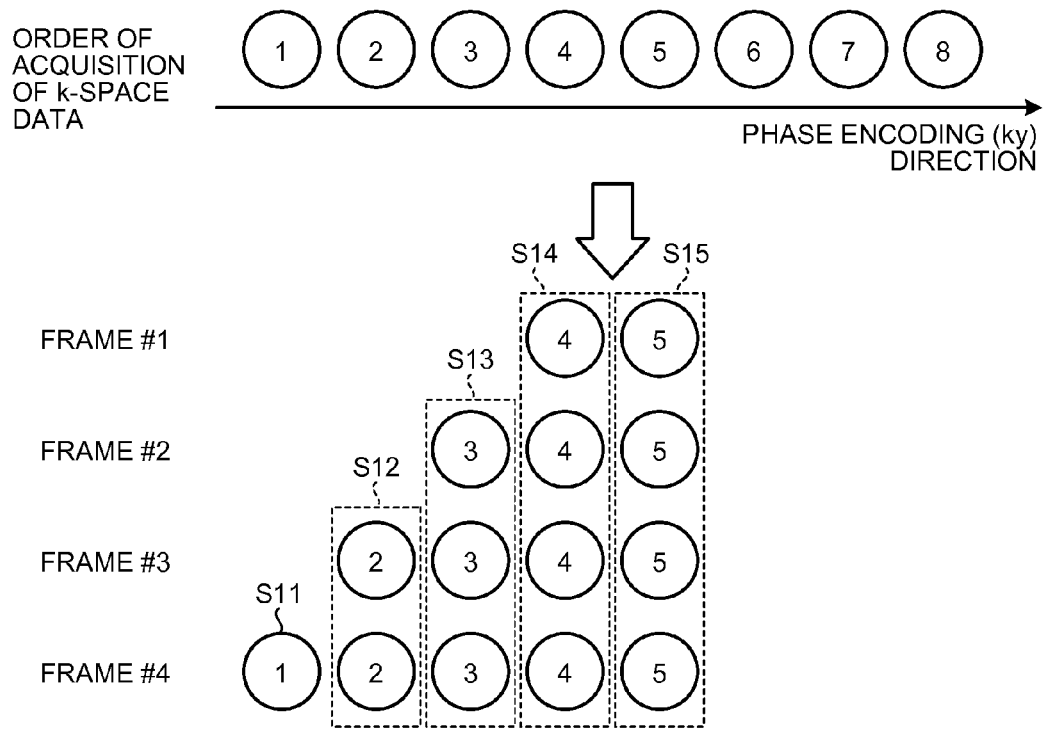
FIGS. 8 and 9 are drawings of examples of a data set extraction process according to a second embodiment.
Figure 9:
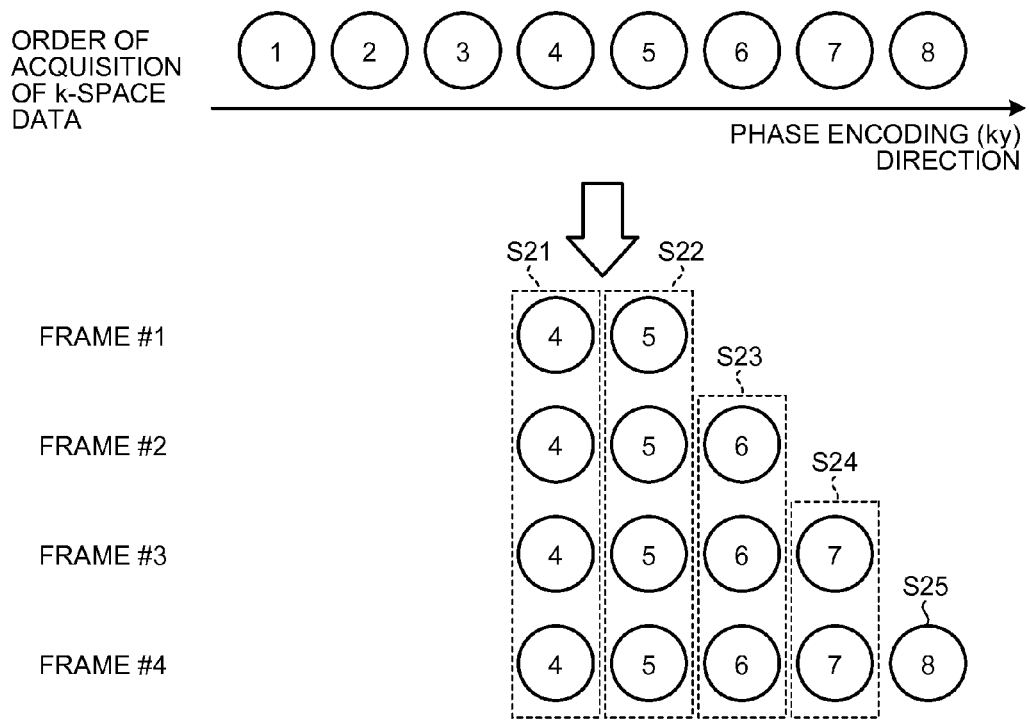

FIGS. 8 and 9 are drawings of examples of a data set extraction process according to the second embodiment. When extracting data sets by implementing the sequential sampling method, the image generator 136 may perform the processes at steps S106-1 through S106-3 illustrated in FIG. 6, in each of the two directions (the past direction and the future direction on the time axis) defined by using the center of the k-space in the phase encoding direction as a reference point.

As illustrated in FIG. 8, the image generator 136 extracts data sets by sequentially adding the pieces of data acquired at times earlier than the time at which the data at the center in terms of the phase encoding direction was acquired. The data acquisition is performed in the order of S11, S12, S13, S14, and S15 illustrated in FIG. 8. In this situation, let us assume that the data corresponding to the order of sampling "4" and "5" is the data at the center in terms of the phase encoding direction. Accordingly, the image generator 136 extracts "frame #1" including the data corresponding to the order of sampling "4" and "5"; "frame #2" including data up to the data corresponding to the order of sampling "3" acquired at the immediately preceding time point in the direction toward the past (hereinafter, "past direction"); "frame #3" further including data up to the data corresponding to the order of sampling "2"; and "frame #4" further including data up to the data corresponding to the order of sampling "1". As explained here, the image generator 136 conducts the search on the left side in the past direction.

After that, by performing the processes at steps S106-1 through S106-3 illustrated in FIG. 6 on the extracted data sets, the image generator 136 selects a data set that is usable in the reconstructing process, with respect to the past direction from the time at which the data at the center in terms of the phase encoding direction was acquired.

Further, as illustrated in FIG. 9, in a similar manner, the image generator 136 extracts data sets by sequentially adding the pieces of data acquired at times later than the time at which the data at the center in terms of the phase encoding direction was acquired. The data acquisition is performed in the order of S21, S22, S23, S24, and S25 illustrated in FIG. 9. In this situation, let us assume that the data corresponding to the order of sampling "4" and "5" is the data at the center in terms of the phase encoding direction. Accordingly, the image generator 136 extracts "frame #1" including the data corresponding to the order of sampling "4" and "5"; "frame #2" including data up to the data corresponding to the order of sampling "6" acquired at the immediately following time point in the direction toward the future (hereinafter, "future direction"); "frame #3" further including data up to the data corresponding to the order of sampling "7"; and "frame #4" further including data up to the data corresponding to the order of sampling "8". As explained here, the image generator 136 conducts the search on the right side in the future direction.

After that, by performing the processes at steps S106-1 through S106-3 illustrated in FIG. 6 on the extracted data sets, the image generator 136 selects a data set that is usable in the reconstructing process, with respect to the future direction from the time at which the data at the center in terms of the phase encoding direction was acquired.

Subsequently, the image generator 136 generates and outputs a reconstructed image from, for example, a data set obtained by combining the data set selected in the past direction with the data set selected in the future direction.

Third Embodiment

Next, as a third embodiment, a method will be explained by which data corresponding to the encoding processes required by a sensitivity encoding (SENSE) process is acquired at the first stage and data corresponding to the remaining encoding processes is acquired at the second stage. The data acquired at the first stage is the data that has lower resolution than the output resolution and corresponds to encoding processes at regular intervals. An advantage of this method is that it is possible to ensure image quality that is at least equivalent to image quality obtained from parallel imaging, if the subject has no movement before the completion of the data acquisition at the first stage.

Figure 10:
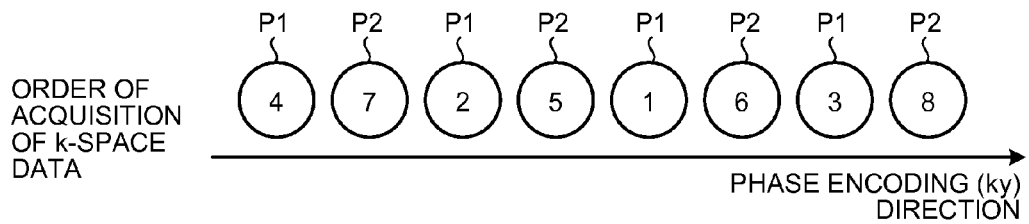
FIGS. 10 and 11 are drawings of examples of a data set extraction process according to a third embodiment.
Figure 11:
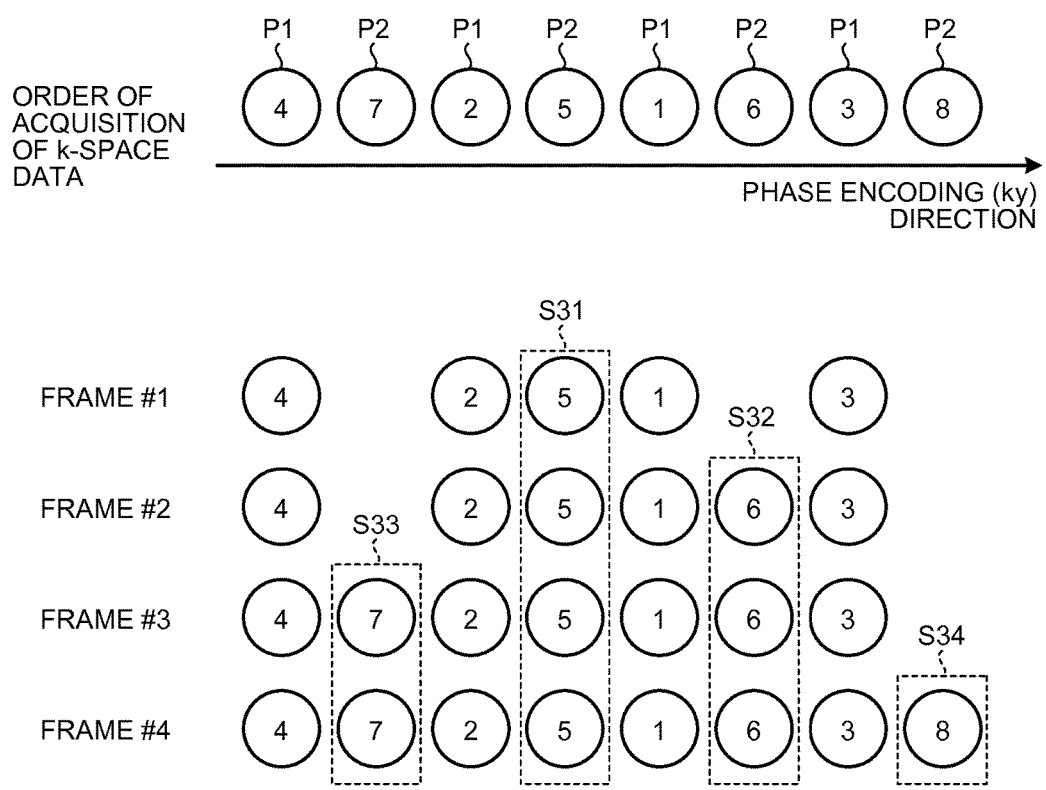

FIGS. 10 and 11 are drawings of examples of a data set extraction process according to the third embodiment. For example, in the third embodiment, the sequence controller 120 acquires data corresponding to the order of sampling "1" to "4" at the first stage as indicated with "P1" in FIG. 10 and further acquires data corresponding to the order of sampling "5" to "8" at the second stage as indicated with "P2".

For the data acquired at the first stage, the image generator 136, at first, extracts data sets in the same manner as in the method explained in the first embodiment and performs the processes at steps S106-1 through S106-3 illustrated in FIG. 6. Alternatively, on the assumption that the subject had no movement at the first stage, it is also acceptable to omit the process of searching for a time at which the subject had a movement.

Subsequently, when the data sets including all the data have been selected in the data set selecting process performed on the data acquired at the first stage, the image generator 136 searches for a time at which the subject had a movement with respect to the data acquired at the second stage. As illustrated in FIG. 11, while the data acquired at the first stage, i.e., the data corresponding to the order of sampling "1" to "4" is all included as valid data, the image generator 136 extracts data sets corresponding to new time points, according to the order of sampling at the second stage.

The data acquisition at the second data is performed in the order of S31, S32, S33, and S34 illustrated in FIG. 11. Thus, the image generator 136 extracts "frame #1" including data up to the data corresponding to the order of sampling "5" at the second stage, in addition to the data corresponding to the order of sampling "1" to "4" acquired at the first stage; "frame #2" further including data up to the data corresponding to the order of sampling "6"; "frame #3" further including data up to the data corresponding to the order of sampling "7"; and "frame #4" further including data up to the data corresponding to the order of sampling "8".

Subsequently, to realize a reconstructing process to be performed on each of the data sets, the image generator 136 may implement a publicly-known method (e.g., the method described in Pruessmann K. P. et al., "Advances in Sensitivity Encoding with Arbitrary k-Space Trajectories," Mag. Reson. In Med. 46: 638-0651, 2001) for reconstructing data acquired on variable density levels. Alternatively, to perform the reconstructing process with a smaller amount of calculation, the image generator 136 may implement the method described below.

Figure 12:
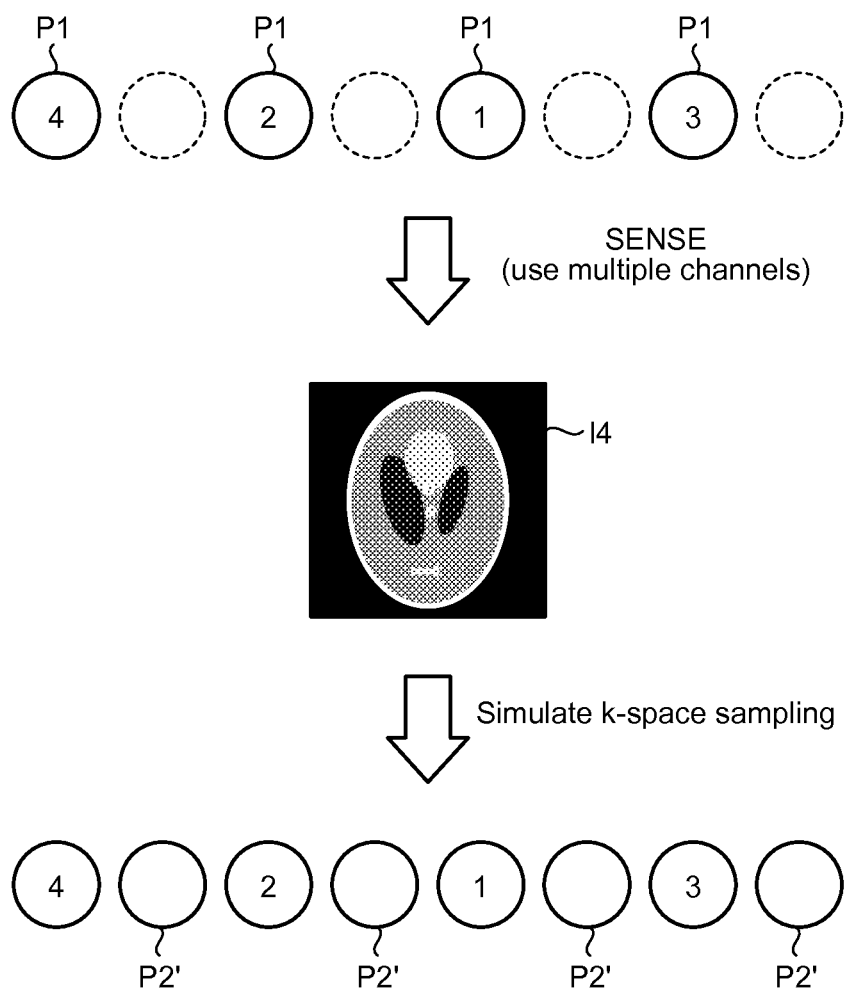
FIGS. 12 and 13 are drawings for explaining a reconstructing process according to the third embodiment.
Figure 13:
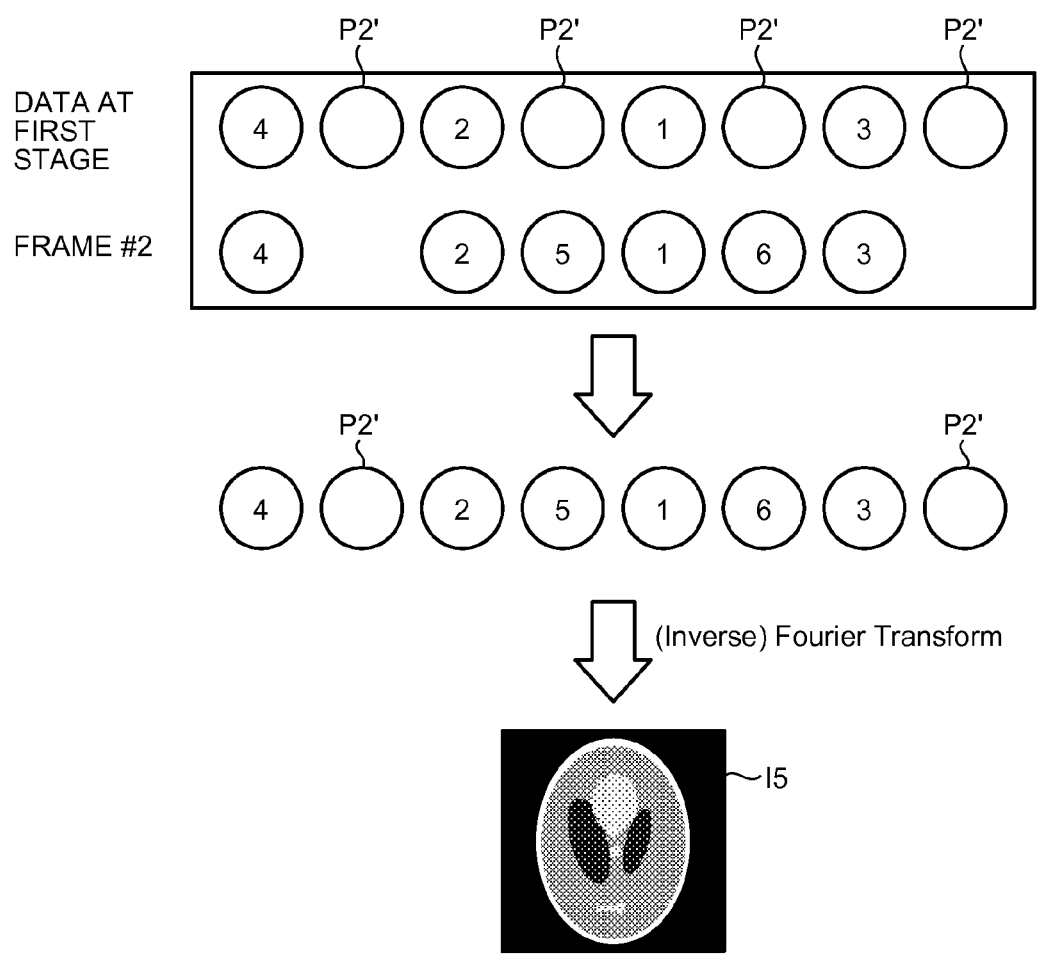

FIGS. 12 and 13 are drawings for explaining a reconstructing process according to the third embodiment. As illustrated in FIG. 12, for example, the image generator 136 generates a reconstructed image I4 through a SENSE process by using all of the data acquired at the first stage in advance and sensitivity distribution information corresponding to each of channels (channels obtained by distributing/combining coil elements of the reception coil 109). Subsequently, the image generator 136 estimates and regenerates k-space data P2' for each of the channels, by simulating a data acquiring process by using the reconstructed image I4 and the sensitivity distribution information. In other words, by applying the sensitivity distribution information corresponding to each of the channels to the reconstructed image I4, the image generator 136 calculates, for each of the channels, an intermediate reconstructed image I4' reflecting the sensitivity of the channel. After that, by reverse-reconstructing the calculated intermediate reconstructed image I4' corresponding to each of the channels, the image generator 136 generates k-space data having the same resolution as the output resolution, for each of the channels.

Subsequently, with respect to each of the data sets generated at the different time points at the second stage, the image generator 136 replaces only the missing data with estimated k-space data P2' and subsequently generates reconstructed images by applying a Fourier transform thereto. For example, as illustrated in FIG. 13, with respect to "frame #2" including data up to the data corresponding to the order of sampling "6", the image generator 136 replaces missing data with the k-space data P2' and subsequently obtains a reconstructed image I5 by applying a Fourier transform thereto. According to this method, it is possible to reduce the calculation amount in the reconstructing process at step S106-1 illustrated in FIG. 6 at the second stage. Alternatively, for example, when implementing the method illustrated in FIG. 13 also, the image generator 136 may implement a publicly-known method (e.g., the method described in Pruessmann K. P. et al., "Advances in Sensitivity Encoding with Arbitrary k-Space Trajectories," Mag. Reson. In Med. 46: 638-0651, 2001) for reconstructing data acquired on variable density levels, to generate the reconstructed image for the selected data set at step S106-4. It is possible to improve the image quality of the reconstructed image to be output.

The third embodiment is explained while using the exemplary method in which the data is sampled in a centric manner; however, possible embodiments are not limited to this example. The method by which the data is acquired at the two separate stages is similarly applicable to the sequential sampling method. In that situation, for example, as explained in the second embodiment, the image generator 136 is able to perform the process of searching for a time at which the subject had a movement with respect to the two directions (the past direction and the future direction) on the time axis.

Further, when the sequence controller 120 has acquired, at the first stage in the third embodiment, the data close to the center of the k-space at the same resolution as the output resolution, the image generator 136 may use the GRAPPA method to estimate the missing data at the first stage. For example, as a result of the sequence controller 120 having acquired the data corresponding to the order of sampling "5" and "6" illustrated in FIG. 10 at the first stage, instead of at the second stage, the image generator 136 is able to perform a calibration process by implementing the GRAPPA method. In other words, by using the data close to the center of the k-space acquired at the same resolution as the output resolution, the image generator 136 calculates an interpolation coefficient used for estimating the missing data. After that, by applying the calculated interpolation coefficient also to missing data in the perimeter of the k-space, the image generator 136 estimates the missing data.

A Modification Example of the Third Embodiment

In the description of the third embodiment above, the method is explained by which, when the k-space data is acquired at the same resolution as the output resolution, the order of acquisition is changed so that the data corresponding to the encoding processes required by the SENSE process is acquired at the first stage, whereas the data corresponding to the remaining encoding processes is acquired at the second stage. However, possible embodiments are not limited to this example. For instance, the method described above is also similarly applicable to a situation where k-space data is acquired only at resolution levels lower than the output resolution anyway.

Figure 14:
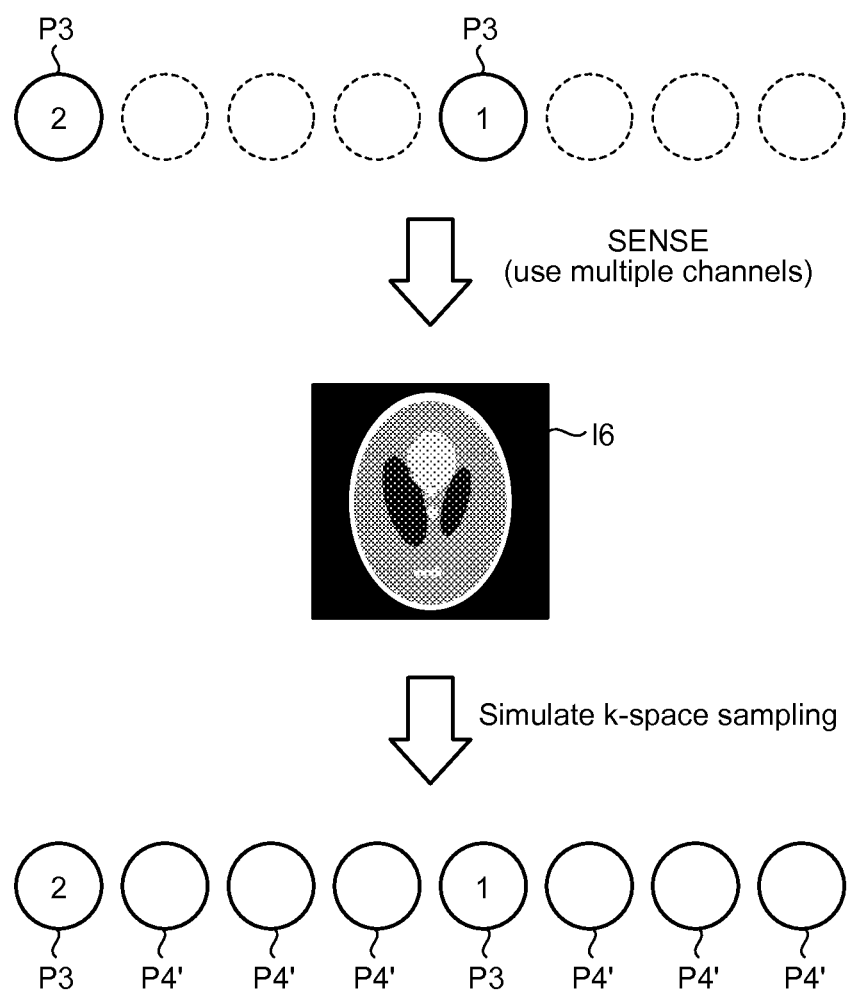
FIGS. 14 and 15 are drawings for explaining a reconstructing process according to a modification example of the third embodiment.
Figure 15:
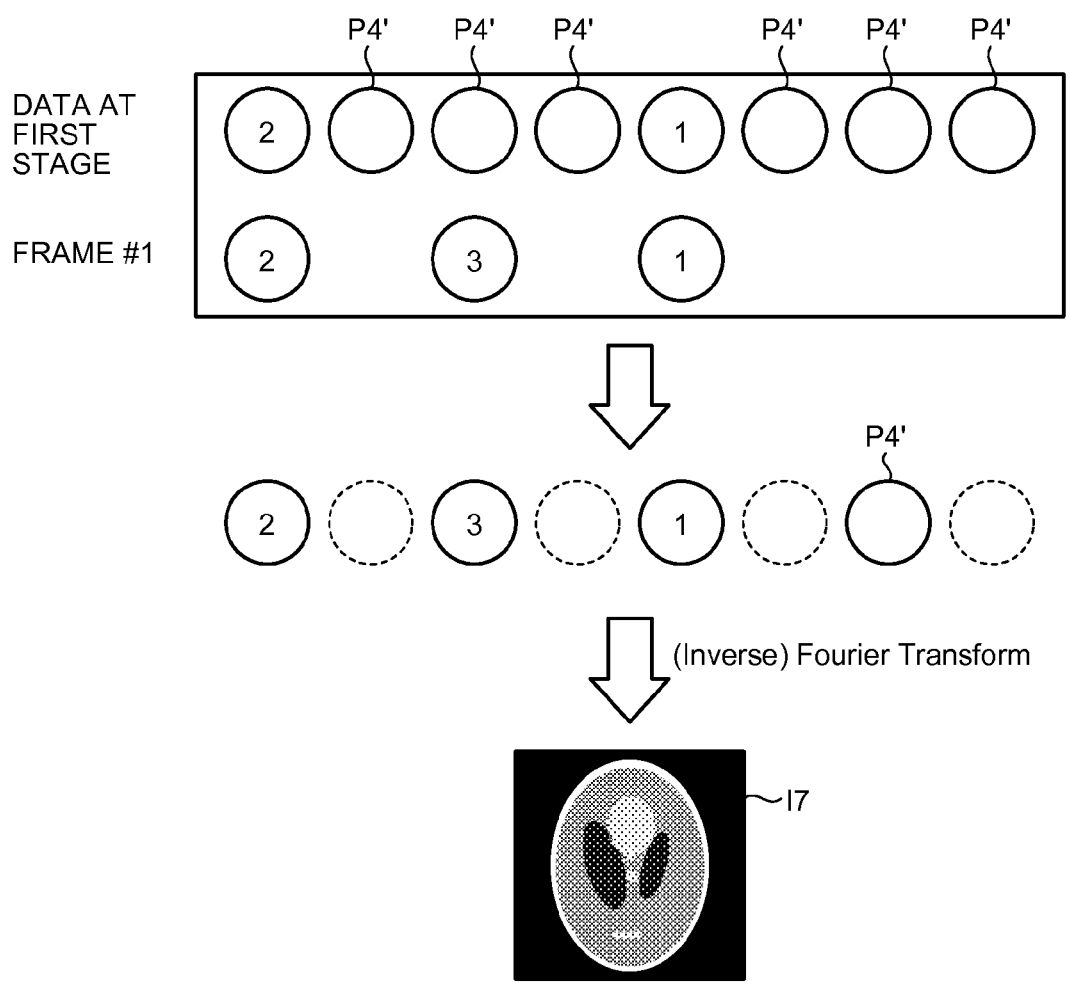

FIGS. 14 and 15 are drawings for explaining a reconstructing process according to a modification example of the third embodiment. For example, let us discus a situation where the sequence controller 120 acquires k-space data at a resolution level equal to half of the output resolution, with respect to the phase encoding direction. In other words, let us discuss the situation where the sequence controller 120 acquires the k-space data by thinning out the data at regular intervals, so that the reduction factor in the SENSE process is "2" with respect to the phase encoding direction.

In that situation, the data acquired by the sequence controller 120 at the first stage has, as illustrated in FIG. 14, a data amount equal to one fourth (¼) of the data amount from a full sampling process, as calculated by multiplying ½ by ½. In this situation, even when the image generator 136 does not use any publicly-known method (e.g., the method described in Pruessmann K. P. et al., "Advances in Sensitivity Encoding with Arbitrary k-Space Trajectories," Mag. Reson. In Med. 46: 638-0651, 2001) for reconstructing data acquired on variable density levels, the image generator 136 is able to reconstruct the data sets, by implementing the method described in the third embodiment without applying any modification thereto. In other words, with respect to the data sets generated at the different time points at the second stage, the image generator 136 may treat only the data that is supposed to have been acquired by the end of the second stage (i.e., only half the data) as missing data and replace the missing data with estimated k-space data and may subsequently reconstruct an image by performing a SENSE process thereon.

First, the image generator 136 generates a reconstructed image I6 through a SENSE process by using all of the data acquired at the first stage and the sensitivity distribution information corresponding to each of channels. Subsequently, the image generator 136 estimates and regenerates k-space data P4' for each of the channels, by simulating a data acquiring process by using the reconstructed image I6 and the sensitivity distribution information. After that, with respect to each of the data sets generated at the different time points at the second stage, the image generator 136 replaces only the missing data with the estimated k-space data P4' and subsequently generates a reconstructed image by performing a SENSE process thereon. For example, as illustrated in FIG. 15, with respect to "frame #1" including data up to the data corresponding to the order of sampling "3", the image generator 136 replaces the missing data with the k-space data P4' and subsequently obtains a reconstructed image I7 by performing a SENSE process thereon.

Needless to say, with respect to the data sets generated at the different times at the second stage, the image generator 136 may treat the data corresponding to the full sampling process as missing data, replace the missing data with estimated k-space data, and subsequently perform a reconstructing process using a Fourier transform.

In the description above, the examples are explained in which the sampling process equal to a half (½) or one fourth (¼) of the data is performed at the first stage; however, these are merely examples. It is possible to arbitrarily set the intervals for the down sampling process.

Further, in the exemplary embodiments described above, the data in such a range that is not affected by the movement is selected, while the data is added to the data close to the center of the k-space according to the order of sampling or according to the reverse order. This process is, in other words, to select the data set including the data at the center of the k-space in such a range that is not affected by the movement.

In other words, in the exemplary embodiments described above, the image generator 136 specifies, on the basis of the function values, the data set corresponding to the time at which the subject had a movement from among the plurality of data sets and selects the data set corresponding to the time closer to the time at which the data at the center of the k-space was acquired than the time corresponding to the specified data set.

Fourth Embodiment

Next, a fourth embodiment will be explained. In the first embodiment described above, the example is explained in which, when the data corresponding to the first quantity of encoding processes is acquired as the k-space data, the data at the center part of the k-space is acquired prior to the data at the perimeter part of the k-space (according to the centric order). In contrast, as the fourth embodiment, an example will be explained in which the data at a perimeter part of the k-space is acquired prior to the data at a center part of the k-space (according to a reverse centric order).

Figure 16:
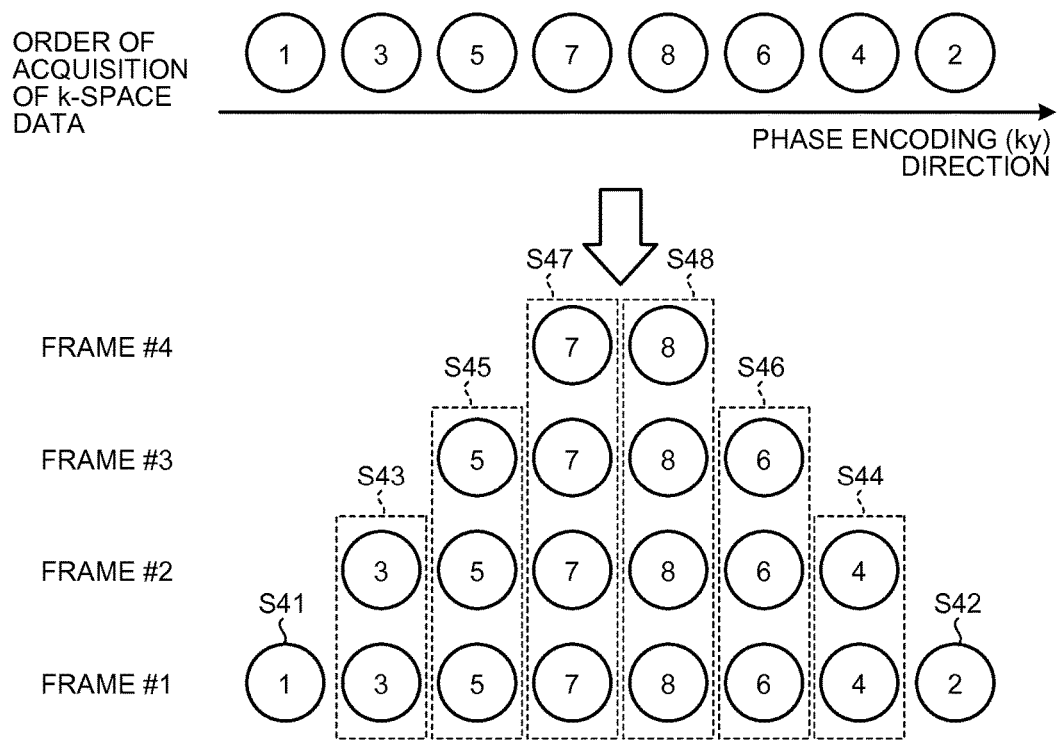
FIG. 16 is a drawing of an example of a data set extraction process according to a fourth embodiment.

FIG. 16 is a drawing of an example of a data set extraction process according to the fourth embodiment. For example, as illustrated in FIG. 16, the MRI apparatus 100 samples data corresponding to eight encoding processes in the phase encoding direction, from the perimeter of the k-space toward the center thereof.

After that, in the fourth embodiment, the image generator 136 accumulates data from the ending time of the sampling process to a targeted time in the direction toward the past, contrary to the first embodiment, and further extracts the accumulated data as a data set corresponding to the targeted time.

For example, as illustrated in FIG. 16, from the data corresponding to the eight encoding processes acquired in a time-series into the k-space, the image generator 136 extracts data sets in a time series corresponding to four time points in the direction toward the past, while using a time point corresponding to data from two encoding processes as a unit time point. The data acquisition is performed in the order of S41 to S48 illustrated in FIG. 16. In that situation, the image generator 136 extracts the data corresponding to S48 and S47 as a data set corresponding to the fourth time point (frame #4), which is the last time point. Further, the image generator 136 extracts the data set resulting from adding the data corresponding to S46 and S45 to the data corresponding to S48 and S47, as a data set corresponding to the third time point (frame #3), which immediately precedes the fourth time point. Further, the image generator 136 extracts the data set resulting from adding the data corresponding to S44 and S43 to the data corresponding to S48 to S45, as a data set corresponding to the second time point (frame #2), which immediately precedes the third time point. Further, the image generator 136 extracts the data set resulting from adding the data corresponding to S42 and S41 to the data corresponding to S48 to S43, as a data set corresponding to the first time point (frame #1), which immediately precedes the second time point.

After that, in the same manner as in the first embodiment, for example, the image generator 136 calculates the function values of the deviating value detection function for the reconstructed images of the extracted data sets and selects a data set of which the calculated function value satisfies the criterion. For example, from among the plurality of data sets, the image generator 136 selects such a data set of which the difference between the function value at a target time and the function value at the immediately preceding time point does not exceed a predetermined threshold value and which corresponds to the earliest time (having the smallest value).

In this situation, for example, the image generator 136 calculates the function values between the data sets and specifies a data set corresponding to the time at which the subject had a movement from among the plurality of data sets on the basis of the calculated function values. After that, the image generator 136 selects such a data set that corresponds to a time later in the time series than the time corresponding to the specified data set and that has the largest quantity of encoding processes for the data. Like in the first embodiment, this process is, in other words, to select such a targeted data set for which the difference between the function value thereof and the function value of another data set having a smaller quantity of encoding processes than the targeted data set is equal to or smaller than a predetermined threshold value and which has the largest quantity of encoding processes for the data.

After that, the image generator 136 generates a reconstructed image for the selected data set and causes the display 135 to display the generated reconstructed image.

As explained above, in the fourth embodiment, even if the data in the perimeter part of the k-space is acquired prior to the data in the center part of the k-space, the image is generated from the data sets obtained by gradually adding the data to the data close to the center of the k-space in the reverse order of the order of sampling, starting from the last time point of the sampling process in the direction toward the past, in such a range that is not affected by the movement. With this arrangement, it is possible to provide the image in which the artifacts caused by the movement are reduced.

Fifth Embodiment

Next, a fifth embodiment will be explained. In the fifth embodiment, an example will be explained in which, when the data corresponding to the first quantity of encoding processes is acquired as the k-space data, data corresponding to odd ordinal numbers is acquired in the former half, whereas data corresponding to even ordinal numbers is acquired in the latter half. In that situation, for the data corresponding to the odd ordinal numbers, the data is acquired starting with the data close to the center of the k-space. On the contrary, for the data corresponding to the even ordinal numbers, the data is acquired starting with the data close to the perimeter of the k-space.

Figure 17:
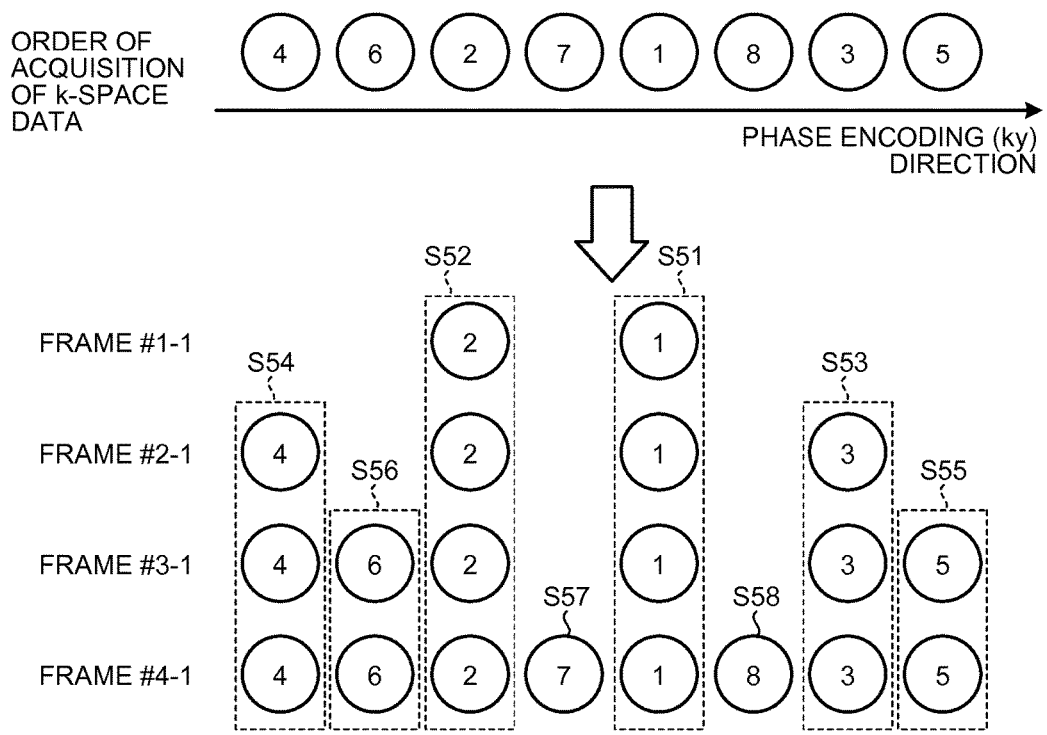
FIGS. 17 and 18 are drawings of examples of a data set extraction process according to a fifth embodiment.
Figure 18:
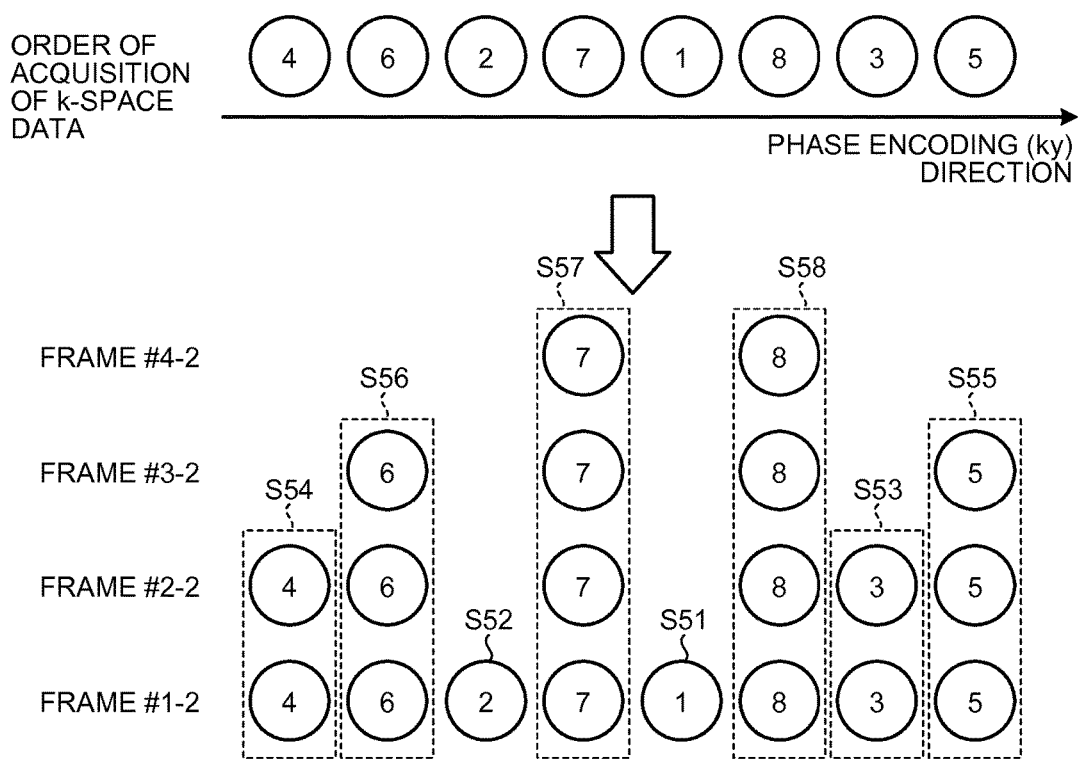

FIGS. 17 and 18 are drawings of examples of a data set extraction process according to the fifth embodiment. For example, as illustrated in FIGS. 17 and 18, in the fifth embodiment, when acquiring data corresponding to eight encoding processes with respect to the phase encoding direction, the MRI apparatus 100 acquires the data corresponding to the odd ordinal numbers in the former half ("1" to "4" illustrated in FIGS. 17 and 18) and acquires the data corresponding to the even ordinal numbers in the latter half ("5" to "8" illustrated in FIGS. 17 and 18). In that situation, for the data corresponding to the odd ordinal numbers, the MRI apparatus 100 sequentially samples the data starting with the data close to the center of the k-space. On the contrary, for the data corresponding to the even ordinal numbers, the MRI apparatus 100 sequentially samples the data starting with the data distant from the center of the k-space.

After that, in the fifth embodiment, the image generator 136, at first, accumulates the data, from the sampling start time to a targeted time, in the direction toward the future and extracts the accumulated data as a data set corresponding to the targeted time.

For example, as illustrated in FIG. 17, from the data corresponding to eight encoding processes acquired in a time series into the k-space, the image generator 136 extracts, in the direction toward the future, data sets in a time series corresponding to four time points, while using a time point corresponding to data from two encoding processes as a unit time point. The data acquisition is performed in the order of S51 to S58 illustrated in FIG. 17. In that situation, the image generator 136 extracts the data corresponding to S51 and S52 as a data set corresponding to the first time point (frame #1-1), which is the very first time point. Further, the image generator 136 extracts the data set resulting from adding the data corresponding to S53 and S54 to the data corresponding to S51 and S52, as a data set corresponding to the second time point (frame #2-1), which immediately follows the first time point. Further, the image generator 136 extracts the data set resulting from adding the data corresponding to S55 and S56 to the data corresponding to S51 to S54, as a data set corresponding to the third time point (frame #3-1), which immediately follows the second time point. Further, the image generator 136 extracts the data set resulting from adding the data corresponding to S57 and S58 to the data corresponding to S51 to S56, as a data set corresponding to the fourth time point (frame #4-1), which immediately follows the third time point.

After that, in the same manner as in the first embodiment, for example, the image generator 136 calculates the function values of the deviating value detection function for the reconstructed images of the extracted data sets and selects a data set of which the calculated function value satisfies the criterion. For example, from among the plurality of data sets, the image generator 136 selects such a data set of which the difference between the function value at a target time and the function value at the immediately preceding time point does not exceed a predetermined threshold value and which corresponds to the latest time (having the largest value).

In this situation, for example, the image generator 136 calculates the function values between the data sets and specifies a data set corresponding to the time at which the subject had a movement from among the plurality of data sets on the basis of the calculated function values. After that, the image generator 136 selects such a data set that corresponds to a time earlier in the time series than the time corresponding to the specified data set and that has the largest quantity of encoding processes for the data.

After that, in the fifth embodiment, the image generator 136 further accumulates the data, from the sampling start time to a targeted time, in the direction toward the past and extracts the accumulated data as a data set corresponding to the targeted time.

For example, as illustrated in FIG. 18, from the data corresponding to eight encoding processes acquired in a time series into the k-space, the image generator 136 extracts, in the direction toward the past, data sets in a time series corresponding to four time points, while using a time point corresponding to data from two encoding processes as a unit time point. The data acquisition is performed in the order of S51 to S58, in the same manner as illustrated in FIG. 17. In that situation, the image generator 136 extracts the data corresponding to S58 and S57 as a data set corresponding to the fourth time point (frame #4-2), which is the last time point. Further, the image generator 136 extracts the data set resulting from adding the data corresponding to S56 and S55 to the data corresponding to S58 and S57, as a data set corresponding to the third time point (frame #3-2), which immediately precedes the fourth time point. Further, the image generator 136 extracts the data set resulting from adding the data corresponding to S54 and S53 to the data corresponding to S58 to S55, as a data set corresponding to the second time point (frame #2-2), which immediately precedes the third time point. Further, the image generator 136 extracts the data set resulting from adding the data corresponding to S52 and S51 to the data corresponding to S58 to S53, as a data set corresponding to the first time point (frame #1-2), which immediately precedes the second time point.

After that, the image generator 136 generates a reconstructed image for the data set selected in the former half and a reconstructed image for the data set selected in the latter half. Subsequently, the image generator 136 evaluates the generated images by using a predetermined criterion for evaluating the image quality and causes the display 135 to display one of the images having the higher image quality. In this situation, for example, the image generator 136 may select the image having the larger quantity of encoding processes as the image having the higher image quality.

In another example, the image generator 136 may generate the images for the data sets from the former half and the latter half, cause the display 135 to display the generated images, and subsequently, may receive an operation to select one of the images from the operator and regenerate the selected image by implementing a method having a high reconstruction cost, or the like. In addition, when causing the display 135 to display the generated images, the image generator 136 may further cause the display 135 to display information that makes it possible to identify the image judged to have the higher image quality. For example, the image generator 136 may cause a mark to be displayed so as to be appended to the image judged to have the higher image quality, the mark indicating that the image has higher image quality than the other image.

As explained above, in the fifth embodiment, the MRI apparatus 100 acquires the data corresponding to the odd ordinal numbers in the former half and acquires the data corresponding to the even ordinal numbers in the latter half. In that situation, for the data corresponding to the odd ordinal numbers, the data is acquired starting with the data close to the center of the k-space. For the data corresponding to the even ordinal numbers, the data is acquired starting with the data close to the perimeter of the k-space. When the k-space data is acquired by implementing this method, the data at the center of the k-space or the data closest to the center of the k-space is acquired at the beginning and the end of the acquiring process.

In this regard, in the fifth embodiment, the images are generated from the data set resulting from gradually adding the data to the data close to the center of the k-space according to the order of sampling, starting from the first time point of the sampling process in the direction toward the future, and also from the data set resulting from gradually adding the data to the data close to the center of the k-space according to the reverse order of the order of sampling, starting from the last time point of the sampling process in the direction toward the past. Subsequently, the image having the higher image quality is displayed. With this arrangement, it is possible to provide the image in which the artifacts caused by the movement are further reduced.

Further, in another example, when the k-space data is sampled sequentially or sampled in the centric order or the reverse centric order, the image generator 136 may select data sets in such a range that is not affected by the movement while gradually accumulating the data starting from the first time point of the sampling process in the direction toward the future and may further select data sets in such a range that is not affected by the movement while gradually adding data starting from the last time point of the sampling process in the direction toward the past. After that, the image generator 136 may generate an image by using one of the data sets.

In that situation, for example, the image generator 136 may generate an image by using one of the two selected data sets that include the data at the center of the k-space. Alternatively, the image generator 136 may generate an image from each of the two data sets, evaluate the generated images by using a predetermined criterion for evaluating the image quality, and cause the display 135 to display one of the images having the higher image quality. In yet another example, the image generator 136 may generate an image from each of the two data sets, cause the display 135 to display the generated images, and subsequently, may receive an operation to select one of the images from the operator and regenerate the selected image by implementing a method having a high reconstruction cost, or the like.

Other Embodiments

Possible embodiments are not limited to the exemplary embodiments described above.

In the exemplary embodiments above, the method is explained in which the data sets are selected on the basis of the function values of the deviating value detection function; however, possible embodiments are not limited to this example. For instance, the image generator 136 may extract data sets while gradually decreasing the quantity of encoding processes included in each data set, repeatedly cause reconstructed images to be displayed until the operator is satisfied, and select a data set by receiving a selection made by the operator.

For example, when the entirety of the k-space data corresponds to 256 encoding processes, the image generator 136 generates an image reconstructed by using data corresponding to 256 encoding processes, causes the display 135 to display the generated image, and also causes pressing buttons such as "redo the reconstructing process" and "end" to be displayed. The operator views the image and if an artifact is visually recognized, the operator presses the button "redo the reconstructing process". In that situation, for example, the image generator 136 decreases the quantity of encoding processes so as to generate an image by using data corresponding to 192 encoding processes and further causes the display 135 to display the generated image again. According to this method, the image generator 136 does not even need to calculate the function values of the deviating value detection function for the reconstructed images from the data sets.

Further, the exemplary embodiments above are explained on the assumption that an imaging scan is performed to acquire the data of one cross-sectional image; however, possible embodiments are not limited to this example. The present disclosure is similarly applicable to an imaging scan performed to acquire data of a plurality of cross-sectional images. For example, let us discuss an example in which a plurality of cross-sectional images are sequentially acquired, one image after another. In that situation, it can nonetheless be considered that a subject's movement occurs during an image scan that is performed to acquire the data of one of the plurality of cross-sectional images. Consequently, to reconstruct the one cross-sectional image, the image generator 136 is able to perform the same process as described in the exemplary embodiments above.

Further, in the exemplary embodiments above, the example is explained in which the data is acquired as the k-space data throughout the entirety of the k-space. However, possible embodiments are not limited to this example. The present disclosure is similarly applicable to a half Fourier method by which approximately a half of a k-space is filled by using symmetric characteristics of k-spaces, a zero-fill method by which radio frequency components are filled with zero values, and the like.

The Specific Numerical Values, the Order of Processes, and the Imaging Site

Further, the specific numerical values, the order in which the processes are performed, the imaging site, and the like presented in the exemplary embodiments above are merely examples, in principle. For example, although the imaging site is assumed to be the "brain", possible embodiments are not limited to this example. The imaging site may arbitrarily be selected.

An Image Processing Apparatus

Further, in the exemplary embodiments above, the example is explained in which the MRI apparatus 100 acquires the k-space data, so that the image generator 136 performs the processes on the acquired k-space data; however possible embodiments are not limited this example. For instance, an image processing apparatus that is different from the MRI apparatus 100 may perform the same processes as those performed by the image generator 136 on the k-space data acquired by the MRI apparatus 100. In that situation, the image processing apparatus may receive the k-space data from the MRI apparatus 100 or any other external apparatus via a network or may receive the k-space data via a storage medium. Further, how the k-space data is acquired by the MRI apparatus 100 is not directly related to the processes performed by the image processing apparatus.

Further, the image processing apparatus may be, for example, a workstation, an image storing apparatus (an image server) or an image viewer in a Picture Archiving and Communication System (PACS), any of various types of apparatuses in an electronic medical record system, or the like.

A Computer Program

The instructions presented in the processing procedures described in the exemplary embodiments above may be executed on the basis of a computer program (hereinafter, a "program"), which is software. When a general-purpose computer has the program stored therein in advance and reads the program, it is possible to achieve the same advantageous effects as those achieved by the MRI apparatus or the image processing apparatus described in the exemplary embodiments above. The instructions described in the exemplary embodiments above may be recorded, as the program that is executable by a computer, in a magnetic disk (a flexible disk, a hard disk, or the like), an optical disk (a Compact Disk Read-Only Memory (CD-ROM), a Compact Disk Readable (CD-R), a Compact Disk Rewritable (CD-RW), a Digital Versatile Disk Read-Only Memory (DVD-ROM), a Digital Versatile Disk Readable (DVD±R), a Digital Versatile Disk Rewritable (DVD±RW), or the like), a semiconductor memory, or any recording medium similar to these. As long as the storage medium is readable by a computer or an incorporated system, any storage format may be used. By reading the program from the recording medium and causing a Central Processing Unit (CPU) to execute the instructions written in the program on the basis of the program, the computer is able to realize the same operations as those performed by the MRI apparatus or the image processing apparatus described in the exemplary embodiments above. Needless to say, when the computer obtains or reads the program, the computer may obtain or read the program via a network.

Further, on the basis of the instructions in the program installed into a computer or an incorporated system from a storage medium, an Operating System (OS) working in the computer, database managing software, middleware (MW) used for a network or the like may execute a part of the processes realizing the exemplary embodiments described above. Further, the storage medium does not necessarily have to be a medium that is independent of the computer or the incorporated system. Examples of the storage medium also include a storage medium that has stored therein or has temporarily stored therein the program downloaded after being transferred via a Local Area Network (LAN), the Internet, or the like. Furthermore, the storage medium does not necessarily have to be a single medium. Examples of the storage medium in possible embodiments include the situation where the processes described in the exemplary embodiments above are executed from a plurality of media. Any configuration of the medium/media is acceptable.

The computer or the incorporated system according to the exemplary embodiments is used for executing the processes described in the exemplary embodiments above, on the basis of the program stored in a storage medium. Thus, the computer or the incorporated system may have any configuration and may be a single apparatus such as a personal computer, a microcomputer, or the like or may be a system in which a plurality of apparatuses are connected together via a network. Further, the computer according to the exemplary embodiments does not necessarily have to be a personal computer and may be an arithmetic processing unit included in an information processing device, a microcomputer, or the like. The term "computer" generically refers to any device or apparatus that is able to realize the functions described in the exemplary embodiments by using the program.

By using the magnetic resonance imaging apparatus or the image processing apparatus according to at least one aspect of the exemplary embodiments above, it is possible to reduce the artifacts caused by the movement.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    a sequence controller that acquires k-space data corresponding to a predetermined quantity of encoding processes; and
    an image generator that extracts a plurality of data sets arranged in a time series from the k-space data, selects a data set from among the extracted plurality of data sets so as to reduce an effect caused by a movement of a subject, and generates an image by using the selected data set.

2. The magnetic resonance imaging apparatus according to claim 1, wherein the image generator extracts the plurality of data sets arranged in the time series, according to an order in which the k-space data is acquired.

3. The magnetic resonance imaging apparatus according to claim 2, wherein the image generator extracts the plurality of data sets arranged in the time series, by gradually increasing a quantity of encoding processes for data included in each of the data sets, according to the order in which the k-space data is acquired.

4. The magnetic resonance imaging apparatus according to claim 1, wherein the image generator calculates a function value between data sets and selects the data set from among the plurality of data sets on a basis of the calculated function values.

5. The magnetic resonance imaging apparatus according to claim 4, wherein the image generator specifies, on the basis of the function values, a data set corresponding to a time at which the subject had a movement from among the plurality of data sets and selects such a data set that corresponds to a time earlier in the time series than the time corresponding to the specified data set.

6. The magnetic resonance imaging apparatus according to claim 5, wherein the image generator selects such a data set that corresponds to a time earlier in the time series than the time corresponding to the specified data set and that has a largest quantity of encoding processes for data.

7. The magnetic resonance imaging apparatus according to claim 5, wherein the image generator selects such a data set that corresponds to a time closer to a time when data at a center of a k-space is acquired than the time corresponding to the specified data set.

8. The magnetic resonance imaging apparatus according to claim 4, wherein the image generator specifies, on a basis of the function values, a data set corresponding to a time at which the subject had a movement from among the plurality of data sets and selects such a data set that corresponds to a time later in the time series than a time corresponding to the specified data set.

9. The magnetic resonance imaging apparatus according to claim 8, wherein the image generator selects such a data set that corresponds to a time later in the time series than the time corresponding to the specified data set and that has a largest quantity of encoding processes for data.

10. The magnetic resonance imaging apparatus according to claim 4, wherein the image generator selects such a targeted data set for which a difference between the function value thereof and the function value of another data set having a smaller quantity of encoding processes than the targeted data set is equal to or smaller than a predetermined threshold value and which has a largest quantity of encoding processes for data.

11. The magnetic resonance imaging apparatus according to claim 4, wherein the function value is an L1 norm of differences between the data sets.

12. The magnetic resonance imaging apparatus according to claim 1, wherein the image generator selects a data set in such a range that is not affected by the movement while gradually accumulating data starting from a first point in time of a sampling process in a direction toward future, further selects a data set in such a range that is not affected by the movement while gradually adding data starting from a last point in time of the sampling process in a direction toward past, and generates the image by using one of the data sets.

13. The magnetic resonance imaging apparatus according to claim 1, wherein, when acquiring the data corresponding to the predetermined quantity of encoding processes, the sequence controller acquires data in a center part of the k-space prior to data in a perimeter part of the k-space.

14. The magnetic resonance imaging apparatus according to claim 1, wherein, when acquiring the data corresponding to the predetermined quantity of encoding processes, the sequence controller acquires data in a perimeter part of the k-space prior to data in a center part of the k-space.

15. The magnetic resonance imaging apparatus according to claim 1, wherein the image generator causes a display to display a reconstructed image from a data set selected as a candidate from among the plurality of data sets and a reconstructed image from a data set that is not selected as a candidate, and further selects the data set by receiving a selection made by an operator.

16. An image processing apparatus comprising:
a storage that stores therein k-space data corresponding to a predetermined quantity of encoding processes acquired by a magnetic resonance imaging apparatus; and
an image generator that extracts a plurality of data sets arranged in a time series from the k-space data, selects a data set from among the extracted plurality of data sets so as to reduce an effect caused by a movement of a subject, and generates an image by using the selected data set.

17. A magnetic resonance imaging apparatus comprising:
a sequence controller that acquires k-space data corresponding to a predetermined quantity of encoding processes; and
an image generator that extracts a plurality of data sets arranged in a time series from the k-space data, selects a data set from among the extracted plurality of data sets on a basis of a movement of a subject, and generates an image by using the selected data set, wherein
the image generator extracts the plurality of data sets arranged in the time series, by gradually increasing a quantity of encoding processes for data included in each of the data sets.

* * * * *